US010908227B2

(12) United States Patent
Ling et al.

(10) Patent No.: US 10,908,227 B2
(45) Date of Patent: Feb. 2, 2021

(54) METHOD AND SYSTEM FOR DETECTING RESISTANCE OF INTERNAL SHORT CIRCUIT OF BATTERY

(71) Applicant: INDUSTRIAL TECHNOLOGY RESEARCH INSTITUTE, Hsinchu (TW)

(72) Inventors: Shou-Hung Ling, Taipei (TW);
Shih-Hao Liang, New Taipei (TW);
Tzi-Cker Chiueh, Taipei (TW);
Deng-Tswen Shieh, Hsinchu (TW);
Mao-Cheng Huang, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 174 days.

(21) Appl. No.: 16/002,785

(22) Filed: Jun. 7, 2018

(65) Prior Publication Data

US 2019/0170802 A1    Jun. 6, 2019

(30) Foreign Application Priority Data

Dec. 4, 2017  (TW) .............................. 106142429 A

(51) Int. Cl.
*G01R 31/02* (2006.01)
*G01R 31/36* (2020.01)
(Continued)

(52) U.S. Cl.
CPC ........... *G01R 31/50* (2020.01); *G01R 31/367* (2019.01); *G01R 31/389* (2019.01); *G01R 31/3842* (2019.01)

(58) Field of Classification Search
CPC ............... H02J 7/0031; H02J 2007/004; H02J 2007/0037; Y02E 60/12; H01M 10/48;
(Continued)

(56) References Cited

U.S. PATENT DOCUMENTS 3,786,466 A    1/1974  Naito et al.
5,982,148 A   11/1999  Mercer
(Continued)

FOREIGN PATENT DOCUMENTS

CN    101034141 A    9/2007
CN    106067560 A   11/2016
(Continued)

OTHER PUBLICATIONS

Minhwan Seo et al., Detection of Internal Short Circuit in Lithium Ion Battery Using Model-Based Switching Model Method, MDPI Publishing, pp. 13. (Year: 2016).*
(Continued)

*Primary Examiner* — Nathaniel R Pelton
*Assistant Examiner* — Mohammed J Sharief
(74) *Attorney, Agent, or Firm* — Muncy, Geissler, Olds & Lowe, P.C.

(57) ABSTRACT

A method and a system for detecting resistance of an internal short circuit of a battery are provided. The method includes the following steps. Measuring charging/discharging information of the battery. Calculating a charging/discharging characteristic of the battery according to the charging/discharging information. Aligning the charging/discharging characteristic of the battery according to a comparison characteristic point of a comparison characteristic to obtain an aligned charging/discharging characteristic. Determining whether the battery is normal according to the aligned charging/discharging characteristic or a coulombic efficiency of the battery; and when the battery is determined as abnormal, calculating aligned charging/discharging information according to the aligned charging/discharging characteristic, and calculating the resistance of the internal short circuit of the battery according to the aligned charging/discharging information.

24 Claims, 17 Drawing Sheets

(51) Int. Cl.
  *G01R 31/50* (2020.01)
  *G01R 31/389* (2019.01)
  *G01R 31/3842* (2019.01)
  *G01R 31/367* (2019.01)

(58) Field of Classification Search
  CPC .. G01R 31/50; G01R 31/367; G01R 31/3842; G01R 31/389
  USPC .......................................................... 320/134
  See application file for complete search history.

(56) References Cited

U.S. PATENT DOCUMENTS

| | | | |
|---|---|---|---|
| 8,179,139 B2 | 5/2012 | Kawasumi et al. | |
| 8,308,971 B1* | 11/2012 | Bhat | C07F 9/095 |
| | | | 252/500 |
| 8,334,699 B2 | 12/2012 | Asakura et al. | |
| 8,531,158 B2* | 9/2013 | Wang | H01M 10/0525 |
| | | | 320/132 |
| 8,823,325 B2 | 9/2014 | Ling et al. | |
| 8,866,444 B2 | 10/2014 | Stewart et al. | |
| 8,965,722 B2 | 2/2015 | Yoshida et al. | |
| 9,153,846 B2 | 10/2015 | Liang et al. | |
| 9,229,510 B2 | 1/2016 | Chiueh et al. | |
| 2006/0273761 A1 | 12/2006 | Arai | |
| 2007/0001680 A1 | 1/2007 | Khoo | |
| 2011/0012604 A1 | 1/2011 | Tsujiko et al. | |
| 2012/0077076 A1* | 3/2012 | Cheng | H01M 10/0525 |
| | | | 429/156 |
| 2012/0105069 A1 | 5/2012 | Wang et al. | |
| 2013/0103333 A1 | 4/2013 | Nishida | |
| 2013/0119940 A1* | 5/2013 | Iriyama | H01M 4/485 |
| | | | 320/134 |
| 2013/0127423 A1 | 5/2013 | Liang et al. | |
| 2014/0042977 A1 | 2/2014 | Kim | |
| 2014/0157034 A1 | 6/2014 | Chiueh et al. | |
| 2014/0266060 A1 | 9/2014 | Ying | |
| 2014/0320067 A1 | 10/2014 | Ling et al. | |
| 2015/0022160 A1 | 1/2015 | Greening et al. | |
| 2016/0061907 A1 | 3/2016 | Koba et al. | |
| 2016/0094056 A1 | 3/2016 | Dulle | |
| 2016/0164315 A1 | 6/2016 | Hsu et al. | |
| 2016/0195589 A1 | 7/2016 | Hanyu et al. | |
| 2016/0254687 A1* | 9/2016 | Tanaka | H01M 10/48 |
| | | | 320/112 |
| 2016/0336773 A1 | 11/2016 | Kadirvel et al. | |
| 2016/0370432 A1 | 12/2016 | Sakuma et al. | |
| 2017/0104347 A1 | 4/2017 | Shimonishi et al. | |
| 2017/0133865 A1 | 5/2017 | Chiueh et al. | |
| 2017/0133872 A1 | 5/2017 | Masuda et al. | |
| 2017/0153290 A1 | 6/2017 | Sazhin et al. | |
| 2017/0259687 A1* | 9/2017 | Chikkannanavar | H02J 7/0047 |
| 2019/0305384 A1* | 10/2019 | Liu | G01R 31/396 |

FOREIGN PATENT DOCUMENTS

| | | |
|---|---|---|
| CN | 106154172 A | 11/2016 |
| DE | 112013006736 T5 | 11/2015 |
| EP | 2333892 B1 | 10/2013 |
| JP | 2014006205 A | 1/2014 |
| TW | I398028 B1 | 6/2013 |
| TW | 201531725 A | 8/2015 |
| TW | I523297 B | 2/2016 |
| TW | 201710702 A | 3/2017 |
| WO | WO2014143444 A1 | 9/2014 |
| WO | WO2017/095622 A1 | 6/2017 |

OTHER PUBLICATIONS

Xuning Feng et al, "Online Internal Short Circuit Detection for a Large Format Lithium Ion Battery" Applied Energy 161, Oct. 22, 2015, pp. 168-180.
Matthew Keyser, et al, "NREL/NASA Internal Short-Circuit Instigator in Lithium Ion Cells National Renewable Energy Laboratory" 228th ECS Conference, Oct. 2015, 41 pages.
Minhwan Seo, et al, "Detection of Internal Short Circuit in Lithium Ion Battery Using Model-Based Switching Model Method" Energies 2017, Jan. 10, 2017, pp. 2-13 vol. 2017, 10-76.
A. J. Smith et al, "Delta Differential Capacity Analysis" Journal of the Electrochemical Society 159 (3), Jan. 10, 2012 pp. A290-A293.
Theo Volck et al, "Method for Determination of the Internal Short Resistance and Heat Evolution at Different Mechanical Loads of a Lithium Ion Battery Cell Based on Dummy Pouch Cells" Batteries 2016, Apr. 7, 2016, pp. 1-14 vol. 2016, 2-8.
S. V. Sazhin et al, "Enhancing Li-Ion Battery Safety by Early Detection of Nascent Internal Shorts" Journal of the Electrochemical Society, 164, Dec. 22, 2016, pp. A6281-A628, vol. 164-1.
Ng et al., "Enhanced coulomb counting method for estimating state-of-charge and state-of-health of lithium-ion batteries," Applied Energy 86 (2009 pp. 1506-1511.
European Patent Office, Office Action, dated Jan. 31, 2019, 12 pages.

* cited by examiner

METHOD AND SYSTEM FOR DETECTING RESISTANCE OF INTERNAL SHORT CIRCUIT OF BATTERY

This application claims the benefit of Taiwan application Serial No. 106142429, filed Dec. 4, 2017, the disclosure of which is incorporated by reference herein in its entirety.

TECHNICAL FIELD

The disclosure relates to a method and a system for detecting resistance of an internal short circuit of a battery.

BACKGROUND

With the ever-progressing technologies, more and more electronic devices, power storage systems and electric vehicles are equipped with batteries. An internal short circuit of a battery may cause the battery burning, putting a user into danger and making huge losses to manufacturers. Therefore, there is a need for a solution for determining whether a battery is abnormal and detecting resistance of an internal short circuit of the battery.

SUMMARY

The disclosure is directed to a method and a system for detecting resistance of an internal short circuit of a battery.

According to an embodiment, a method for detecting resistance of an internal short circuit of a battery is provided. The method includes steps of: measuring charging/discharging information of a battery; calculating a charging/discharging characteristic of the battery according to the charging/discharging information, wherein the charging/discharging information includes voltage information, current information, time information or battery temperature information; aligning the charging/discharging characteristic of the battery according to a comparison characteristic point of a comparison characteristic to obtain an aligned charging/discharging characteristic, wherein the charging/discharging characteristic includes a relationship between battery capacity information of the battery and the voltage information of the battery; determining whether the battery is normal according to the aligned charging/discharging characteristic or a coulombic efficiency of the battery; and when the battery is determined as abnormal, calculating aligned charging/discharging information according to the aligned charging/discharging characteristic, and calculating the resistance of the internal short circuit of the battery according to the aligned charging/discharging information, wherein the aligned charging/discharging information includes aligned voltage information, aligned current information, aligned battery capacity or aligned time information.

According to another embodiment, a system for detecting resistance of an internal short circuit of a battery is provided. The system for detecting resistance of an internal short circuit of a battery includes a battery set, a data acquisition (DAQ) module and a characteristic calculating module. The battery set includes a battery. The DAQ module is configured to measure charging/discharging information of the battery, wherein the charging/discharging information includes voltage information, current information, time information or battery temperature information. The characteristic calculating module is configured to calculate a charging/discharging characteristic of the battery according to the charging/discharging information, align the charging/discharging characteristic according to a comparison characteristic point of a comparison characteristic to obtain an aligned charging/discharging characteristic, and determine whether the battery is normal according to the aligned charging/discharging characteristic or a coulombic efficiency of the battery, wherein the charging/discharging characteristic includes a relationship between battery capacity information and the voltage information. The system further includes an internal short-circuit resistance calculating module. The internal short-circuit resistance calculating module is configured to calculate aligned charging/discharging information according to the aligned charging/discharging characteristic, and calculate the resistance of the internal short circuit of the battery according to the aligned charging/discharging information when the battery is determined as abnormal, wherein the aligned charging/discharging information includes aligned voltage information, aligned current information, aligned battery capacity information or aligned time information.

To better understand the disclosure, preferred embodiments are given in detail with the accompanying drawings below.

Figure 1A:
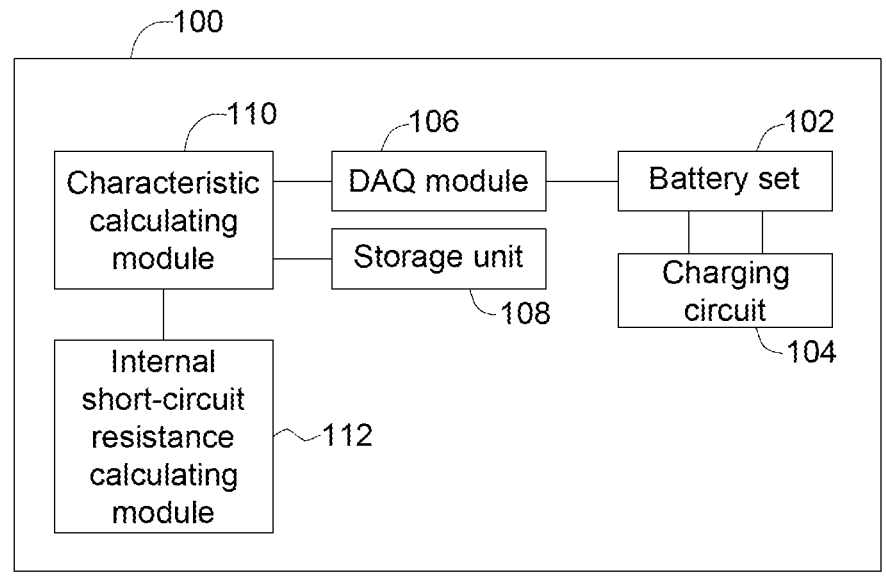
FIG. 1A is a schematic diagram of a system for detecting resistance of an internal short circuit of a battery according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the application are based on general definition in the technical field of the application. If the application describes or explains one or some terms, definition of the terms are based on the description or explanation of the application. Each embodiment of the disclosure includes one or more technical features. In possible implementation, one person skilled in the art can selectively implement a part or all of the technical features of any of the embodiments, or selectively combine a part or all of the technical features of the embodiments.

FIG. 1A shows a schematic diagram of a system 100 for detecting resistance of an internal short circuit (ISC) (abbreviated as ISC resistance in the following disclosure) of a battery according to an embodiment. In this embodiment, the system 100 for detecting ISC resistance of a battery is suitable for detecting ISC resistance of a battery. In this embodiment, the system 100 for detecting ISO resistance of a battery includes a battery set 102, a charging circuit 104, a data acquisition (DAQ) module 106, a storage unit 108, a characteristic calculating module 110 and an internal short-circuit resistance calculating module 112. In one embodiment, the system 100 for detecting ISO resistance of a battery may further include an abnormal discharging circuit (not shown) that is coupled to the characteristic calculating module 110. In one embodiment, the system 100 for detecting ISO resistance of a battery may be placed in a mobile device, e.g., a cell phone, a personal digital assistant (PDA), a tablet computer, a laptop computer, a point-of-sales (POS) machine, a portable media player, a digital camera or a wearable device. In one embodiment, the system 100 for detecting ISO resistance of a battery may also be placed in a vehicle, e.g., an automobile, a motorcycle, an aircraft, a boat, a submarine, an unmanned automobile, a drone or an unmanned boat. In one embodiment, the system 100 for detecting ISO resistance of a battery may also be placed in a toy or a model of any of the above vehicles.

The battery set 102 is coupled to the charging circuit 104 and the DAQ module 106. The battery set 102 includes one or multiple batteries. The batteries of the battery set 102 may be connected in series, in parallel, or in an array structure. For example, the array structure may adopt the reconfigurable array of inexpensive batteries architecture (RAIBA) technology. In one embodiment, the above batteries may be rechargeable batteries, such as lithium-ion batteries, lithium metal batteries, lead-acid batteries, nickel-cadmium batteries, nickel-metal hydride batteries, or may be super capacitors, fuel cells or solar cells.

The charging circuit 104 is coupled to the battery set 102. The charging circuit 104 may be a circuit or a switch. The charging circuit 104 is capable of charging or terminating the charging of the batteries in the battery set 102. In one embodiment, the charging circuit 104 may be external to the system 100 for detecting ISO resistance of a battery.

The DAQ module 106 is coupled to the battery set 102 and the characteristic calculating module 110. The DAQ module 106 may be one or multiple separate or integrated meters or sensors, e.g., a voltmeter, an ammeter, a temperature sensor and/or a time recorder. In one embodiment, the DAQ module 106 may be a detection circuit. In one embodiment, the DAQ module 106 may be a device or an instrument independent of the system 100 for detecting ISO resistance of a battery. In one embodiment, the DAQ module 106 may measure and/or record a voltage, a current, a temperature and/or a time of the batteries in the battery set by the above meters, sensors, detection circuits, devices and/or instruments.

The storage unit 108 is coupled to the characteristic calculating module 110. The storage unit 108 may be a hardware unit, e.g., a memory, a hard drive, a solid-state disk (SSD), a flash memory or a read-only memory (ROM).

The characteristic calculating module 110 is coupled to the DAQ module 106, the storage unit 108 and the ISO resistance calculating module 112. The characteristic calculating module 110 may be a hardware circuit, a software module executed by a processor (not shown) or a controller (not shown), or may be partly a circuit and partly a software module executed by a processor or a controller. The function of the characteristic calculating module 110 will be described below.

The ISO resistance calculating module 112 is coupled to the characteristic calculating module 110. The ISO resistance calculating module 112 may be a hardware circuit, a software module executed by a processor (not shown) or a controller (not shown), or may be partly a circuit and partly a software module executed by a processor or a controller. The function of the ISO resistance calculating module 112 will be described below. In one embodiment, the characteristic calculating module 110 and the ISO resistance calculating module 112 may be integrated into one module.

Figure 1B:
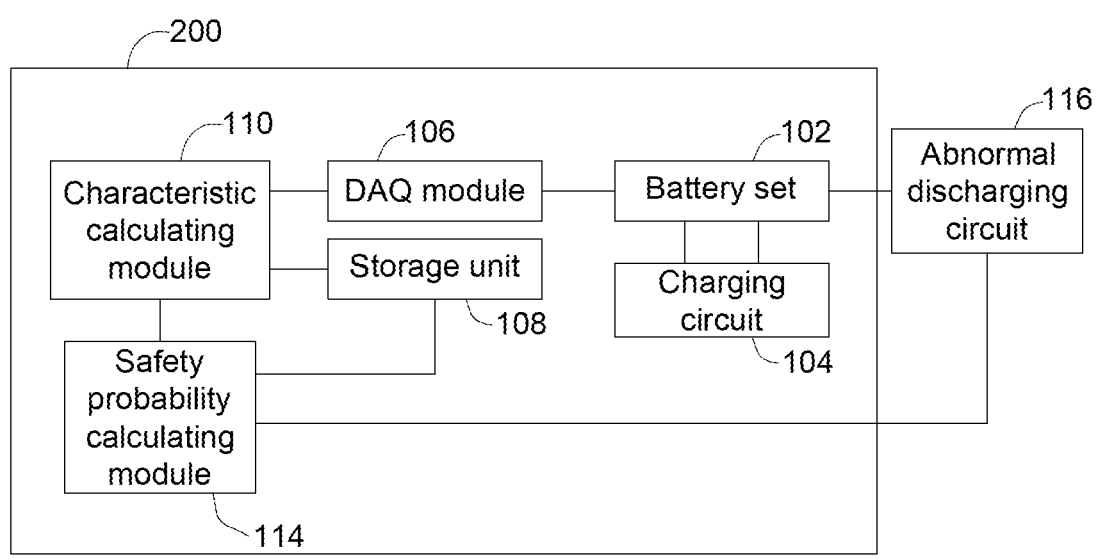
FIG. 1B is a schematic diagram of a system for determining a discharging process of a battery according to an embodiment.
Figure 1C:
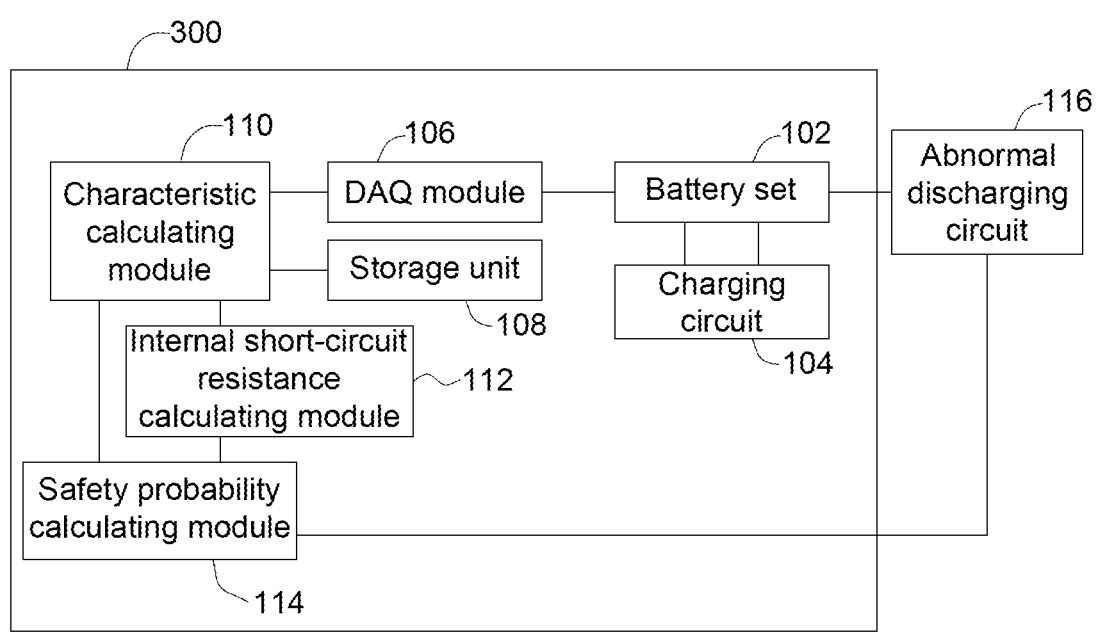
FIG. 1C is a schematic diagram of a system for detecting resistance of an internal short circuit and determining a discharging process of a battery according to an embodiment.

FIG. 1B shows a schematic diagram of a system 200 for determining a discharging process of a battery according to an embodiment. In this embodiment, the system 200 for determining a discharging process of a battery is suitable for determining a discharging process of a battery. In this embodiment, the system 200 for determining a discharging process of a battery includes a battery set 102, a charging circuit 104, a DAQ module 106, a storage unit 108, a characteristic calculating module 110, a safety probability calculating module 114 and an abnormal discharging circuit 116. In one embodiment, the system 200 for determining a discharging process of a battery may be placed in a mobile device, e.g., a cell phone, a PDA, a tablet computer, a laptop computer, a POS machine, a portable media player, a digital camera, or a wearable device. In one embodiment, the system 200 for determining a discharging process of a battery may also be placed in a vehicle, e.g., an automobile, a motorcycle, an aircraft, a boat, a submarine, an unmanned automobile, a drone or an unmanned boat. In one embodiment, the system 200 for determining a discharging process of a battery may also be placed in a toy or a model of any of the above vehicles. The battery set 102, the charging circuit 104, the DAQ module 106, the storage unit 108 and the characteristic calculating module 110 in FIG. 1B are identical or similar to the charging circuit 104, the DAQ module 106, the storage unit 108 and the characteristic calculating module 110 in FIG. 1A, and associated details can be referred to the corresponding description of FIG. 1A. In this embodiment, the characteristic calculating module 110 is coupled to the DAQ module 106, the storage unit 108 and the safety probability calculating module 114.

The safety probability calculating module 114 is coupled to the characteristic calculating module 110, the storage unit 108 and the abnormal discharging circuit 116. The safety probability calculating module 114 may be a hardware circuit, a software module executed by a processor (not shown) or a controller (not shown), or may be partly a circuit and partly a software module executed by a processor or a controller. The function of the safety probability calculating module 114 will be described below. In one embodiment, the characteristic calculating module 110 and the safety probability calculating module 114 may be integrated into one module.

The abnormal discharging circuit 116 is coupled to the battery set 102 and the safety probability calculating module 114. The abnormal discharging circuit 116 may include one or multiple variable resistors, or include one or multiple fixed resistors, or include a combination of one or multiple variable resistors and/or one or multiple fixed resistors, where the combination may be series connection or parallel connection. In one embodiment, the abnormal discharging circuit 116 may include a circuit consisting of one or multiple active components or other passive components. Active components are, e.g., metal-oxide-semiconductor field-effect transistors (MOSFETs) or bipolar transistors. Passive components are, e.g., inductors or capacitors.

FIG. 1O shows a schematic diagram of a system 300 for detecting ISO resistance of a battery and determining a discharging process of a battery according to an embodiment. In this embodiment, the system 300 for detecting ISO resistance of a battery and determining a discharging process of a battery is suitable for calculating ISO resistance of a battery and/or determining a discharging process of a battery. In this embodiment, the system 300 for detecting ISO resistance of a battery and determining a discharging process of a battery includes a battery set 102, a charging circuit 104, a DAQ module 106, a storage unit 108, a characteristic calculating module 110, an ISO resistance calculating module 112, a safety probability calculating module 114 and an abnormal discharging circuit 116. In one embodiment, the system 300 for detecting ISO resistance of a battery and determining a discharging process of a battery may be placed in a mobile device, e.g., a cell phone, a PDA, a tablet computer, a laptop computer, a POS machine, a portable media player, a digital camera, or a wearable device. In one embodiment, the system 300 for detecting ISO resistance of a battery and a discharging process of a battery may also be placed in a vehicle, e.g., an automobile, a motorcycle, an aircraft, a boat, a submarine, an unmanned automobile, a drone or an unmanned boat. In one embodiment, the system 300 for detecting ISO resistance of a battery and a discharging process of a battery may also be placed in a toy or a model of any of the above vehicles. The battery set 102, the charging circuit 104, the DAQ module 106, the storage unit 108, the characteristic calculating module 110 and the ISO resistance calculating module 112 in FIG. 1O are identical or similar to the charging circuit 104, the DAQ module 106, the storage unit 108, the characteristic calculating module 110 and the ISO resistance calculating module 112 in FIG. 1A, and associated details can be referred to the corresponding description of FIG. 1A. The safety probability calculating module 114 and the abnormal discharging circuit 116 in FIG. 1O are identical or similar to the safety probability calculating module 114 and the abnormal discharging circuit 116 in FIG. 1B, and associated details can be referred to the corresponding description of FIG. 1B. In this embodiment, the characteristic calculating module 110 is coupled to the DAQ module 106, the storage unit 108, the ISO resistance calculating module 112 and the safety probability calculating module 114. The ISO resistance calculating module 112 is coupled to the characteristic calculating module 110 and the safety probability calculating module 114. The safety probability calculating module 114 is coupled to the characteristic calculating module 110, the ISO resistance calculating module 112 and the abnormal discharging circuit 116. In one embodiment, the characteristic calculating module 110, the ISO resistance calculating module 112 and the safety probability calculating module 114 may be integrated into one module.

Figure 1D:
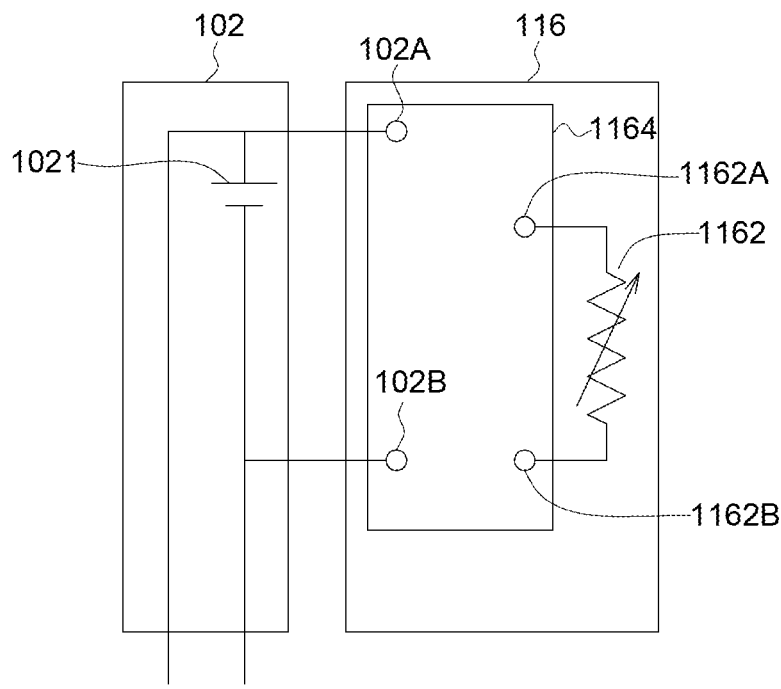
FIG. 1D is a schematic diagram of a battery set and an abnormal discharging circuit according to an embodiment.

FIG. 1D shows a schematic diagram of a battery set 102 and an abnormal discharging circuit 116 according to an embodiment. In this embodiment, the battery set 102 includes a battery 1021. The abnormal discharging circuit 116 includes a variable resistor 1162 and a switch 1164. The abnormal discharging circuit 116 may be controlled to discharge the battery 1021. For example, a first end 1162A of the variable resistor 1162 and a first end 102A of the battery 1021 may be connected, and a second end 1162B of the variable resistor 1162 and a second end 102B of the battery 1021 may be connected, such that the battery 1021 is discharged to the variable resistor 1162. In one embodiment, the resistance of the variable resistor 1162 is adjustable. When the battery 1021 is abnormal, the resistance of the variable resistor 1162 may be adjusted to a minimum value (or a predetermined small resistance value) so as to accelerate the speed of discharging the battery 1021. In one embodiment, when the battery set 102 is under normal use, the resistance of the variable resistor 1162 may be adjusted to a maximum value (or a predetermined large resistance value) or may be disconnected from the battery of the battery set 102, such that the discharging of the battery pack 102 through the variable resistor 1162 is avoided or reduced.

Figure 1E:
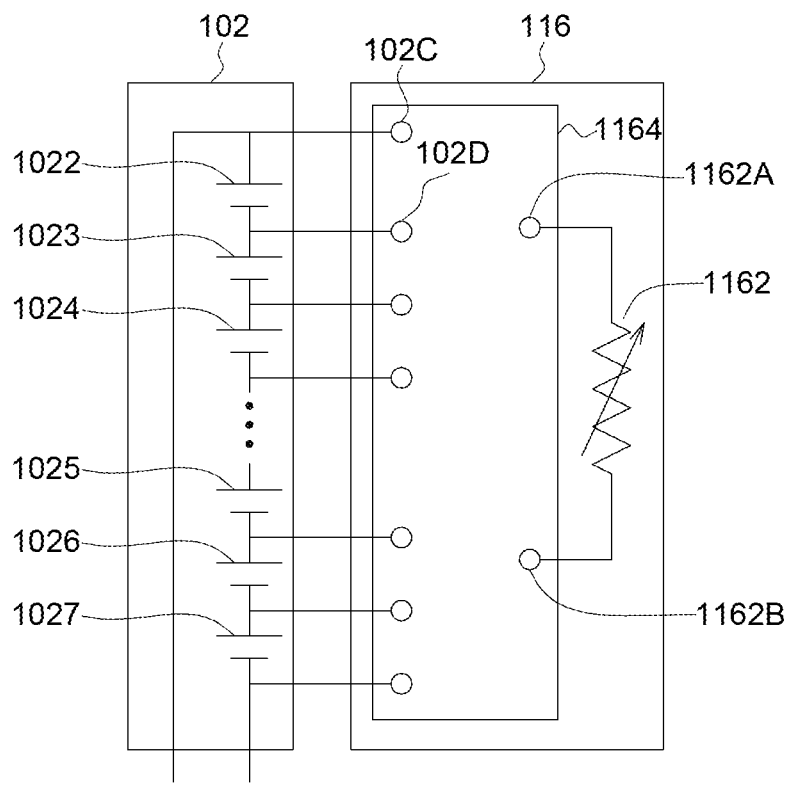
FIG. 1E is a schematic diagram of a battery set and an abnormal discharging circuit according to another embodiment.

FIG. 1E shows a schematic diagram of a battery set 102 and an abnormal discharging circuit 116 according to another embodiment. In this embodiment, the battery set 102 includes a battery 1022, a battery 1023, a battery 1024, a battery 1025, a battery 1026 and a battery 1027. The abnormal discharging circuit 116 includes a variable resistor 1162 and a switch 1164. The abnormal discharging circuit 116 may be controlled to discharge an individual battery or batteries in combination. For example, a first end 1162A of the variable resistor 1162 and a first end 102C of the battery 1022 are connected, and a second end 1162B of the variable resistor 1162 and a second end 102D of the battery 1022 are connected, such that the battery 1022 is discharged to the variable resistor 1162. In one embodiment, the resistance of the variable resistor 1162 is adjustable. When a battery in a battery set is abnormal, e.g., when the battery 1022 is abnormal, the resistance of the variable resistor 1162 may be adjusted to a minimum value (or a predetermined small resistance value), so as to accelerate the speed of discharging an individual battery or batteries in combination. In one embodiment, when a battery set is under normal use, the resistance of the variable resistor 1162 may be adjusted to a maximum value (or a predetermined large resistance value) or may be disconnected from the battery of the battery set 102, such that the discharging of the battery pack 102 through the variable resistor 1162 is avoided or reduced.

Figure 2A:
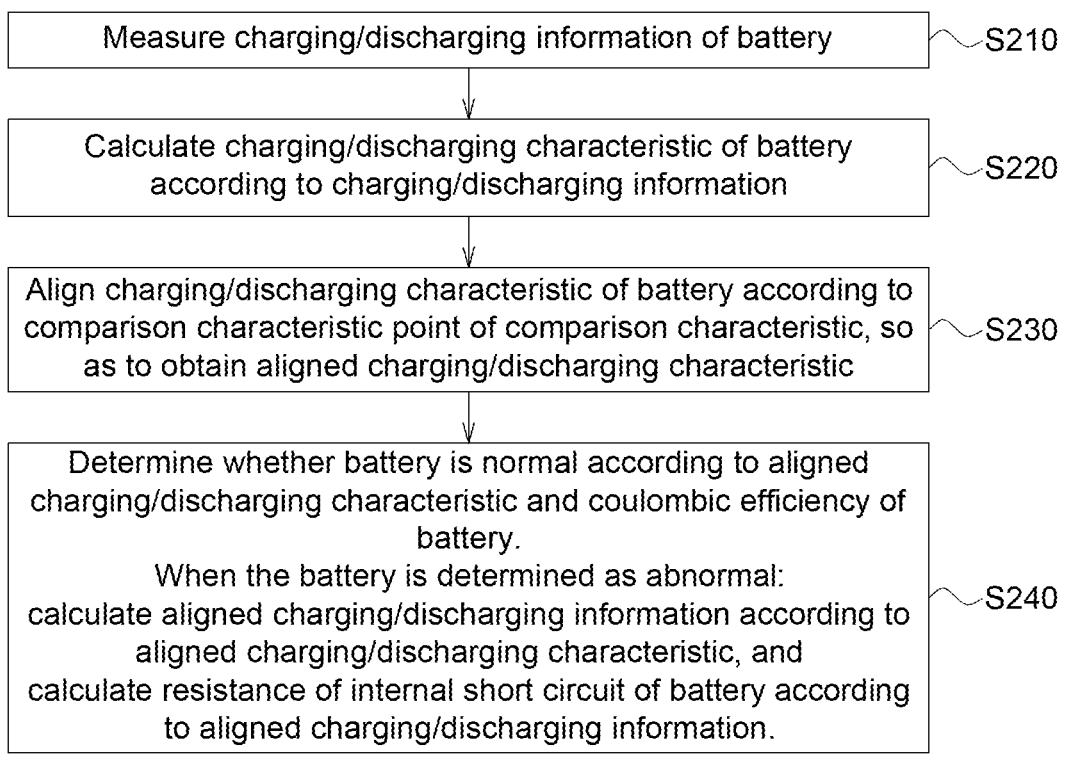
FIG. 2A is a flowchart of a method for detecting resistance of an internal short circuit of a battery according to an embodiment.

FIG. 2A shows a flowchart of a method for detecting ISO resistance of a battery according to an embodiment. Referring to FIG. 1A, FIG. 1D, FIG. 1E and FIG. 2A, in step S210, the DAQ module 106 is configured to measure charging/discharging information of a battery. The charging/ discharging information includes voltage information, current information, time information and/or battery temperature information. In one embodiment, the DAQ module 106 may measure the charging/discharging information of one single battery, e.g., the charging/discharging information of the battery 1022. In one embodiment, the DAQ module 106 may measure the charging/discharging information of multiple batteries individually, e.g., the charging/discharging information of the battery 1022 and the charging/discharging information of the battery 1023. In one embodiment, the DAQ module 106 may measure charging/discharging information of multiple batteries in combination, e.g., the charging/discharging information of the battery 1022 and the battery 1023 connected in series. The battery 1021 is taken as an example in the following description. In one embodiment, the voltage information includes multiple voltage data, the current information includes multiple current data, the time information includes multiple time data, and the battery temperature information includes multiple battery temperature data. Each piece of voltage data, current data, time data and/or battery temperature data has a corresponding relationship. For example, corresponding to the time data $t_i$, the voltage data is $V_i$, the current data is $I_i$ and/or the battery temperature data is $T_i$. In one embodiment, the charging/discharging information includes charging information during a charging process of the battery 1021 or discharging information during a discharging process of the battery 1021. In one embodiment, the charging/discharging information may be charging information during a charging process of the battery 1021, wherein the charging information includes charging voltage information, charging current information, charging time information and/or charging battery temperature information. The charging process involves, for example, charging from a minimum voltage (e.g., 0 V) of the battery 1021 to a maximum voltage (e.g., 4.2 V) of the battery 1021. In one embodiment, the charging process involves, for example, charging from a predetermined low voltage of the battery 1021 to a predetermined high voltage of the battery 1021. In one embodiment, the charging process involves, for example, charging from a current voltage (e.g., a user charges a cell phone when the battery 1021 of the cell phone still has remaining power) of the battery 1021 to a maximum voltage, a predetermined high voltage or a voltage when the charging ends (e.g., a user terminates the charging of a cell phone when the battery 1021 of the cell phone has not yet been fully charged). In one embodiment, the charging process involves, for example, first charging by a constant current (CC) to a predetermined voltage (e.g., 4.2 V), and then charging by a constant voltage (CV) until the current is very small (e.g., less than a predetermined current) to end the charging process. In one embodiment, the charging/discharging information may be discharging information during a discharging process of the battery 1021, wherein the discharging information includes discharging voltage information, discharging current information, discharging time information and/or discharging battery temperature information. The discharging process involves, for example, discharging from a maximum voltage (e.g., 4.2 V) of the battery 1021 to a minimum voltage (e.g., 0 V) of the battery 1021. In one embodiment, the discharging process involves, for example, discharging from a predetermined high voltage of the battery 1021 to a predetermined low voltage of the battery 1021. In one embodiment, the discharging process involves, for example, discharging from a current voltage of the battery 1021 (e.g., a user plays games on a cell phone) to a minimum voltage, a predetermined low voltage or a voltage when the discharging ends (e.g., a user finishes a game on a cell phone and turns off the cell phone).

Step S220 is performed after step S210. In step S220, the characteristic calculating module 110 is configured to calculate a charging/discharging characteristic of the battery 1021 according to the charging/discharging information. In one embodiment, the charging/discharging characteristic of the battery 1021 includes a relationship between battery capacity information and the voltage information of the battery 1021. In one embodiment, the characteristic calculating module 110 calculates battery capacity information of the battery 1021 according to the current information and the time information of the battery 1021. The characteristic calculating module 110 further draws a battery capacity versus voltage (Q-V) relationship curve to obtain a battery capacity versus voltage (Q-V) relationship. In addition, the characteristic calculating module 110 differentiates the battery capacity information with respect to the voltage information to obtain differential capacity information, and draws a differential capacity (dQ/dV) versus voltage (dQ/dV-V) relationship curve to obtain a differential capacity versus voltage (dQ/dV-V) relationship. In one embodiment, the charging/discharging characteristic is a charging characteristic during a charging process of the battery 1021, e.g., a Q-V relationship and/or a dQ/dV-V relationship during the charging process of the battery 1021. More specifically, the characteristic calculating module 110 calculates charging battery capacity information according to charging current information and charging time information of the battery 1021. For example, the charging current information is multiplied by the charging time information to obtain the charging battery capacity information. The characteristic calculating module 110 draws a relationship curve of the charging battery capacity versus the charging voltage by taking the charging battery capacity as the vertical axis and the charging voltage information as the horizontal axis, so as to obtain the Q-V relationship during the charging process. In one embodiment, the charging voltage information includes multiple charging voltage data, the charging current information includes multiple charging current data, and the charging time information includes multiple charging time data, and thus the calculated charging battery capacity information has a corresponding number of charging battery capacity data. In one embodiment, the characteristic calculating module 110 further differentiates the charging battery capacity information with respect to the charging voltage information to obtain charging differential capacity information. The characteristic calculating module 110 draws a relationship curve of charging differential capacity versus charging voltage by taking the charging differential capacity information as the vertical axis and the charging voltage information as the horizontal axis, so as to obtain a differential capacity versus voltage relationship during the charging process. In one embodiment, the charging/discharging characteristic is a discharging characteristic during a discharging process, e.g., a battery capacity versus voltage (Q-V) relationship and/or a differential capacity (dQ/dV) versus voltage (dQ/dV-V) relationship during a discharging process of the battery 1021. More specifically, the characteristic calculating module 110 calculates discharging battery capacity information of the battery 1021 according to discharging current information and discharging time information of the battery 1021. For example, the discharging current information is multiplied by the discharging time information to obtain discharging battery capacity information. The characteristic calculating module 110 draws a relationship curve of discharging battery capacity versus discharging voltage by taking the discharging battery capacity information as the vertical axis and the discharging voltage information as the horizontal axis, so as to obtain a Q-V relationship during the discharging process. The characteristic calculating module 110 may further differentiate the discharging battery capacity information with respect to the discharging voltage information to obtain discharging differential capacity information. In addition, the characteristic calculating module 110 draws a relationship curve of discharging differential capacity versus discharging voltage by taking the discharging differential capacity information as the vertical axis and the discharging voltage information as the horizontal axis, so as to obtain the dQ/dV-V relationship during the discharging process.

Step S230 is performed after step S220. In step S230, the characteristic calculating module 110 is configured to align the charging/discharging characteristic of the battery 1021 according to a comparison characteristic point of a comparison characteristic, so as to obtain an aligned charging/discharging characteristic. For example, the characteristic calculating module 110 aligns a charging/discharging characteristic point of the charging/discharging characteristic of the battery 1021 with a comparison characteristic point of a comparison characteristic, so as to obtain an aligned charging/discharging characteristic. In one embodiment, the method for the alignment is as follows: The charging/discharging characteristic includes a relationship curve, which includes a charging/discharging characteristic point. The relationship curve of the charging/discharging characteristic is shifted such that the horizontal-axis coordinate and/or the vertical-axis coordinate of the charging/discharging characteristic point is identical to the horizontal-axis coordinate and/or the vertical-axis coordinate of the comparison characteristic point of the comparison characteristic. In one embodiment, the comparison characteristic is stored in the storage unit 108. In one embodiment, the charging/discharging characteristic of the battery is a charging characteristic or a discharging characteristic of the battery 1021, and the comparison characteristic is a history charging characteristic of the battery 1021 or a history discharging characteristic of the battery 1021. In one embodiment, after the battery 1021 has been determined as normal in a previous charging process, the charging characteristic is stored in the storage unit 108 as a history charging characteristic of the battery 1021. In one embodiment, after the battery 1021 has been determined as normal in a previous discharging process, the discharging characteristic is stored in the storage unit 108 as a history discharging characteristic of the battery 1021. In one embodiment, the charging/discharging characteristic of the battery is a charging characteristic or a discharging characteristic of the battery 1021, and the comparison characteristic is a history charging characteristic of another battery or a history discharging characteristic of another battery. The another battery is, for example, a battery of the same manufacturer brand or of the same model as the battery 1021. In one embodiment, the charging/discharging characteristic of the battery 1021 is one of the charging characteristic and the discharging characteristic of the battery 1021, and the comparison characteristic is the other of the charging characteristic and the discharging characteristic of the battery 1021. For example, the charging/discharging characteristic of the battery 1021 is the charging characteristic of the battery 1021, and the comparison characteristic is the discharging characteristic of the battery 1021. Alternatively, the charging/discharging characteristic of the battery 1021 is the discharging characteristic of the battery 1021, and the comparison characteristic is the charging characteristic of the battery 1021. In one embodiment, the charging/discharging characteristic point is a local maximum point and/or a local minimum point of the charging/discharging characteristic. In one embodiment, the comparison characteristic point is a local maximum point and/or a local minimum point of the comparison characteristic. In the following example, to illustrate details of aligning the charging/discharging characteristic point of the battery 1021 with the comparison characteristic point, a differential capacity versus voltage relationship (dQ/dV-V) during a discharging process is taken as the charging/discharging characteristic, and a differential capacity versus voltage relationship (dQ/dV-V) during a charging process is taken as the comparison characteristic. The characteristic calculating module 110 identifies a local maximum point of the relationship curve of discharging differential capacity versus discharging voltage as a discharging local maximum point, identifies a local maximum point of a relationship curve of charging differential capacity versus charging voltage as a charging local maximum point, and shifts the relationship curve of discharging differential capacity versus discharging voltage such that the horizontal-axis coordinate of the discharging local maximum point is substantially identical to the horizontal-axis coordinate of the charging local maximum point, thus completing the alignment. In this embodiment, the shifted relationship curve of discharging differential capacity versus discharging voltage is the aligned charging/discharging characteristic. In one embodiment, the number of the charging/discharging characteristic points and/or the number of the comparison characteristic points may be more than one. In such case, a charging/discharging characteristic point having the largest deviation from the corresponding comparison characteristic point may be omitted. Alternatively, different weightings may be assigned to different charging/discharging characteristic points for the alignment.

Step S240 is performed after step S230. In step S240, the characteristic calculating module 110 is configured to determine whether the battery 1021 is normal according to the aligned charging/discharging characteristic or a coulombic efficiency of the battery 1021. When the battery 1021 is determined as abnormal, the ISO resistance calculating module 112 is configured to calculate aligned charging/discharging information according to the aligned charging/discharging characteristic, and calculate the ISO resistance of the battery 1021 according to the aligned charging/discharging information. The aligned charging/discharging information includes aligned voltage information, aligned current information, aligned battery capacity information and/or aligned time information. In one embodiment, a discharging process of the battery 1021 may be determined according to the calculated ISO resistance, and the battery 1021 may be discharged according to the determined discharging process. In one embodiment, the voltage information has a corresponding relationship with the current information and/or the battery capacity information, and the aligned voltage information also has a corresponding relationship with the aligned current information and/or the aligned battery capacity information. In one embodiment, the current information and/or the battery capacity information, but not the voltage information, is adjusted during the alignment, so as to adjust the corresponding relationship between the aligned voltage information and the aligned current information and/or the aligned battery capacity information. In one embodiment, the voltage information, but not the current information and/or the battery capacity information, is adjusted during the alignment, so as to adjust the corresponding relationship between the aligned voltage information and the aligned current information and/or the aligned battery capacity information. In one embodiment, the time information is not adjusted, and thus the time information after the alignment is identical to the time information before the alignment.

In one embodiment, the charging/discharging characteristic includes a first charging/discharging characteristic and a second charging/discharging characteristic. The first charging/discharging characteristic is a differential capacity versus voltage (dQ/dV-V) relationship of the battery 1021, and the second charging/discharging characteristic is a battery capacity versus voltage (Q-V) relationship of the battery 1021. In step S220, the characteristic calculating module 110 calculates the first charging/discharging characteristic and the second charging/discharging characteristic of the battery 1021 according to the charging/discharging information. In step S230, the characteristic calculating module 110 aligns the first charging/discharging characteristic of the battery 1021 according to a comparison characteristic point of a comparison characteristic, so as to obtain an aligned first charging/discharging characteristic. The characteristic calculating module 110 aligns the second charging/discharging characteristic according to the aligned first charging/discharging characteristic, so as to obtain an aligned second charging/discharging characteristic. For example, the characteristic calculating module 110 aligns the charging/discharging characteristic point of the first charging/discharging characteristic with the comparison characteristic point of the comparison characteristic, so as to obtain the aligned first charging/discharging characteristic. Then the characteristic calculating module 110 shifts the second charging/discharging characteristic according to a difference between the charging/discharging characteristic point of the first charging/discharging characteristic and the charging/discharging characteristic point of the aligned first charging/discharging characteristic, so as to obtain the aligned second charging/discharging characteristic. In step S240, the characteristic calculating module 110 determines whether the battery 1021 is normal according to the aligned first charging/discharging characteristic, the aligned second charging/discharging characteristic, or a coulombic efficiency of the battery 1021. When the battery 1021 is determined as abnormal, the ISO resistance calculating module 112 calculates the ISO resistance of the battery 1021.

Figure 2B:
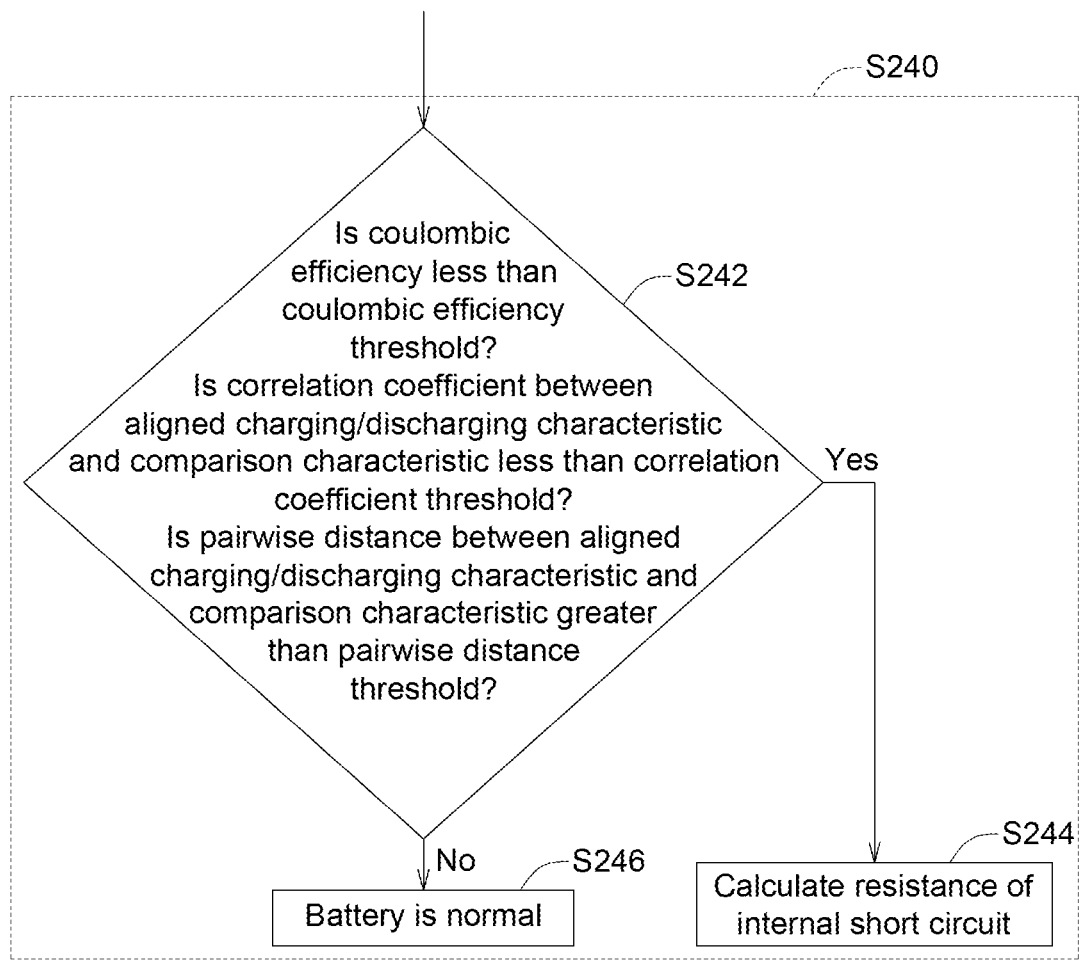
FIG. 2B is a detailed flowchart of step S240 according to an embodiment.

FIG. 2B shows a detailed flowchart of step S240 according to an embodiment. Referring to FIG. 1A, FIG. 1D, FIG. 2A and FIG. 2B, step S240 in FIG. 2B may include steps S242, S244 and S246.

In step S242, the characteristic calculating module 110 determines: (a) whether a coulombic efficiency of the battery 1021 is less than a coulombic efficiency threshold, (b) whether a correlation coefficient between the aligned charging/discharging characteristic and the comparison characteristic is less than a correlation coefficient threshold, and/or (c) whether a pairwise distance between the aligned charging/discharging characteristic and the comparison characteristic is greater than a pairwise distance threshold. In one embodiment, the correlation coefficient is, for example, a Pearson's correlation coefficient. In one embodiment, the pairwise distance is, for example, an Euclidean distance. In one embodiment, a difference between the temperature information of the battery 1021 and comparison temperature information of the comparison characteristic is less than a temperature threshold, e.g., the temperature threshold is ±2° C. In one embodiment, the characteristic calculating module 110 calculates the coulombic efficiency of the battery 1021 according to the charging battery capacity information and the discharging battery capacity information, e.g., the coulombic efficiency=(discharging battery capacity information/charging battery capacity information)*100%. The characteristic calculating module 110 further determines whether the coulombic efficiency of the battery 1021 is less than the coulombic efficiency threshold. In one embodiment, the coulombic efficiency threshold is 95% to 98%. In one embodiment, the charging/discharging characteristic is a differential capacity versus voltage (dQ/dV-V) relationship during a charging process of the battery 1021, and the comparison characteristic is a history charging characteristic of the battery 1021, e.g., the dQ/dV-V relationship during a previous charging process. The characteristic calculating module 110 calculates the correlation coefficient according to the aligned dQ/dV-V relationship during the charging process and the dQ/dV-V relationship during the previous charging process. The characteristic calculating module 110 compares the correlation coefficient with the correlation coefficient threshold to determine whether the correlation coefficient is less than the correlation coefficient threshold. In one embodiment, the correlation coefficient threshold is between 0.95 and 1. In one embodiment, the charging/discharging characteristic is a Q-V relationship during a charging process of the battery 1021, the comparison characteristic is a history charging characteristic, e.g., a Q-V relationship during a previous charging process of the battery 1021. The pairwise distance is calculated according to the aligned Q-V relationship during the charging process and the Q-V relationship during the previous charging process. In one embodiment, a dimensional pairwise distance is first calculated and a non-dimensional pairwise distance is then calculated. For example, an Euclidean distance $d(Q, V)$ of the Q-V relationship is calculated according to the aligned Q-V relationship of the charging process and the Q-V relationship of the previous charging process, wherein $d(Q, V)$ is a dimensional pairwise distance; a non-dimensional pairwise distance=(average pairwise distance/battery capacity)*100%=($d(Q, V)$/quantity of data points)/battery capacity)*100%. In this embodiment, the battery capacity is a changed capacity in the battery during a charging process, such as a changed capacity in the battery from the beginning of the charging process to the end of the charging process; the quantity of data points is the number of data points during the charging process, e.g., the number of charging voltage data or charging battery capacity data from the beginning to the end of the charging process. The characteristic calculating module 110 calculates the non-dimensional pairwise distance, and compares the non-dimensional pairwise distance with a pairwise distance threshold to determine whether the non-dimensional pairwise distance is greater than the pairwise distance threshold. In one embodiment, the pairwise distance threshold is between 2% and 5%.

In one embodiment, the characteristic calculating module 110 determines: (a) whether the coulombic efficiency of the battery 1021 is less than a coulombic efficiency threshold, (b) whether the correlation coefficient between the aligned charging/discharging characteristic and the comparison characteristic is less than the correlation coefficient threshold, and (c) whether the pairwise distance between the aligned charging/discharging characteristic and the comparison characteristic is greater than the pairwise distance threshold. If the characteristic calculating module 110 determines that all of the three above determination conditions are false, the characteristic calculating module 110 determines the battery 1021 as normal; if the characteristic calculating module 110 determines that one or more of the three determination conditions above is true, the characteristic calculating module 110 determines the battery 1021 as abnormal. In one embodiment, the characteristic calculating module 110 determines (a) whether the coulombic efficiency of the battery 1021 is less than a coulombic efficiency threshold, (b) whether the correlation coefficient between the aligned charging/discharging characteristic and the comparison characteristic is less than a correlation coefficient threshold, or (c) whether the pairwise distance between the aligned charging/discharging characteristic and the comparison characteristic is greater than the pairwise distance threshold. If the characteristic calculating module 110 determines that one of the three determination conditions above is false, the characteristic calculating module 110 determines the battery 1021 as normal; if the characteristic calculating module 110 determines that all of the three determination conditions above are true, the characteristic calculating module 110 determines the battery 1021 as abnormal. In one embodiment, the characteristic calculating module 110 may only determine whether the coulombic efficiency of the battery 1021 is less than a coulombic efficiency threshold to determine whether the battery 1021 is normal. In one embodiment, the characteristic calculating module 110 may only determine whether the correlation coefficient between the aligned charging/discharging characteristic and the comparison characteristic is less than the correlation coefficient threshold to determine whether the battery 1021 is normal. In one embodiment, the characteristic calculating module 110 may only determine whether the pairwise distance between the aligned charging/discharging characteristic and the comparison characteristic is greater than the pairwise distance threshold to determine whether the battery 1021 is normal. Step S244 is performed if the determination result of step S242 is true, otherwise step S246 is performed.

In step S244, the ISO resistance calculating module 112 calculates the ISO resistance of the battery 1021. In one embodiment, the ISO resistance calculating module 112 calculates multiple ISO resistance values, which respectively correspond to multiple voltages in a voltage range. For example, the ISO resistance calculating module 112 calculates multiple ISO resistance values corresponding to multiple charging voltage information respectively during one charging process, or calculates multiple ISO resistance values corresponding to multiple discharging voltage information respectively during one discharging process. In one embodiment, the voltage range is included in the charging process or the discharging process.

In step S246, the characteristic calculating module 110 determines the battery 1021 as normal. The battery 1021 can be used normally and/or can be charged and discharged normally.

FIG. 3A to FIG. 3E show simulation schematic diagrams of a method for detecting ISO resistance of a battery according to an embodiment. Referring to FIG. 1A, FIG. 1D, FIG. 2A, FIG. 2B and FIG. 3A to FIG. 3E, in step S210, the DAQ module 106 measures charging/discharging information of the battery 1021. In this embodiment, the charging/discharging information of the battery 1021 is charging information of a charging process. The charging information includes charging voltage information, charging current information, charging time information and charging battery temperature information. The comparison characteristic is a history charging characteristic of the battery 1021, and the history charging characteristic is stored in the storage unit 108.

Figure 3A:
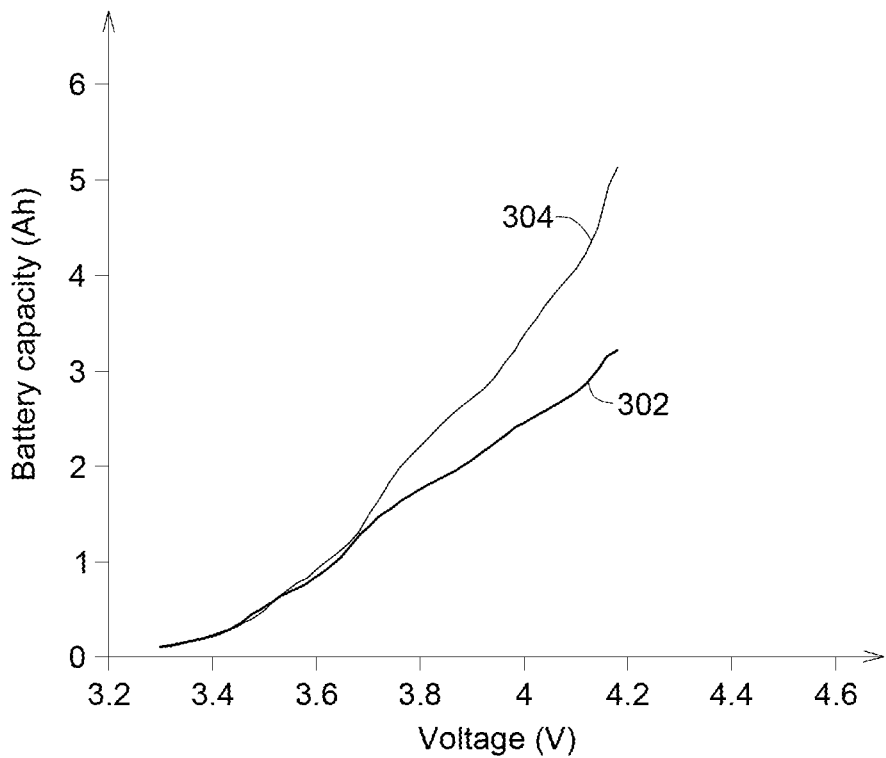
FIGS. 3A to 3E are simulation schematic diagrams of a method for detecting resistance of an internal short circuit of a battery according to an embodiment.

In step S220, the characteristic calculating module 110 calculates the charging/discharging characteristic of the battery 1021 according to the charging/discharging information. In this embodiment, the charging/discharging characteristic includes a first charging/discharging characteristic and a second charging/discharging characteristic. The first charging/discharging characteristic is a dQ/dV-V relationship during the charging process, and the second charging/discharging characteristic is a Q-V relationship during the charging process. The characteristic calculating module 110 calculates the charging battery capacity information according to the charging current information and the charging time information. In FIG. 3A, the vertical axis is the battery capacity and the horizontal axis is the voltage. The characteristic calculating module 110 draws a Q-V relationship curve 304 during the charging process. In one embodiment, the characteristic calculating module 110 further draws a Q-V relationship curve 302 during a previous charging process. In one embodiment, the Q-V relationship curve 302 of the previous charging process may be stored in the storage unit 108.

Figure 3B:
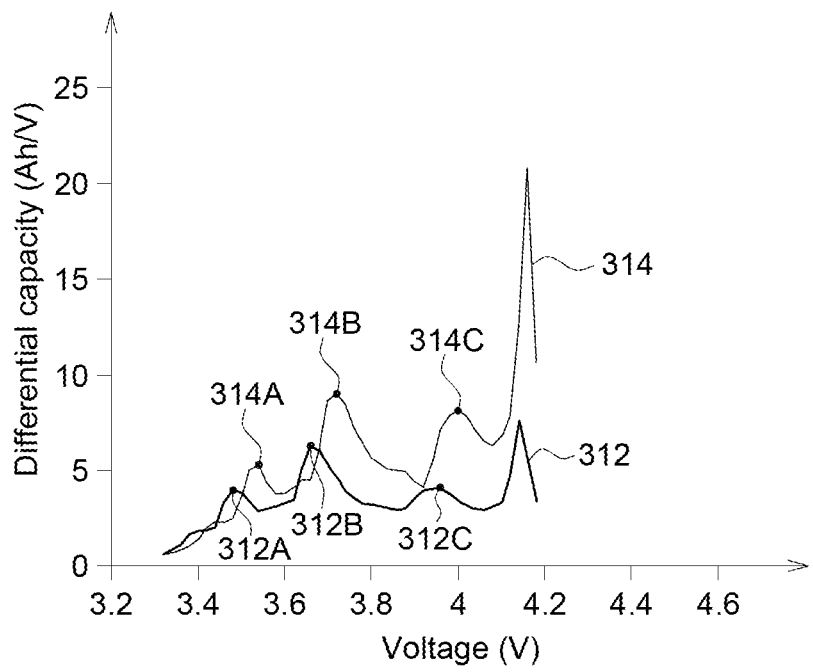

The characteristic calculating module 110 differentiates the charging battery capacity information with respect to the charging voltage information, so as to obtain charging differential capacity information. In FIG. 3B, the vertical axis is the differential capacity and the horizontal axis is the voltage. The characteristic calculating module 110 draws a dQ/dV-V relationship curve 314 during a charging process. In one embodiment, the characteristic calculating module 110 further draws a dQ/dV-V relationship curve 312 during a previous charging process. In one embodiment, the dQ/dV-V relationship curve 312 of the previous charging process may be stored in the storage unit 108.

Figure 3C:
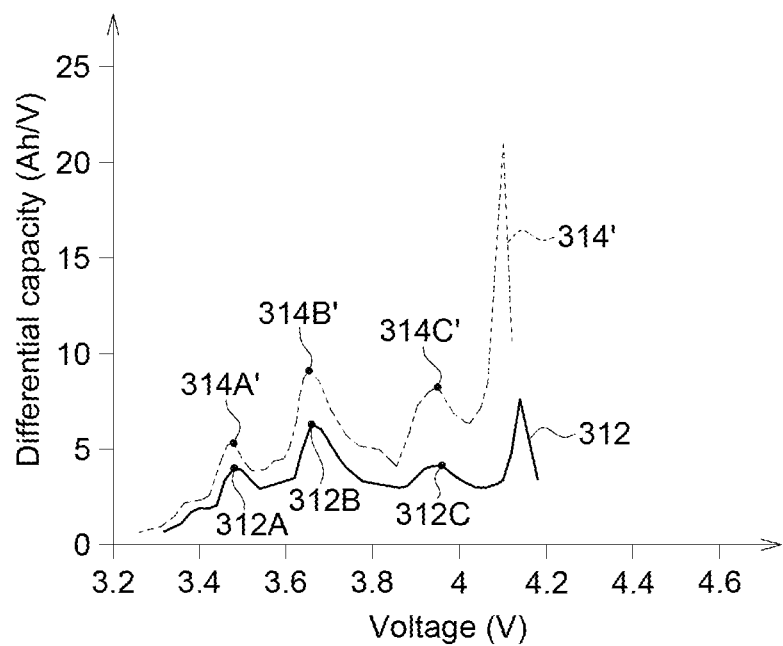

In step S230, the characteristic calculating module 110 aligns the charging/discharging characteristic of the battery 1021 according to the comparison characteristic point of the comparison characteristic, so as to obtain an aligned charging/discharging characteristic. In this embodiment, the characteristic calculating module 110 aligns the first charging/discharging characteristic of the battery 1021 according to the comparison characteristic point of the comparison characteristic, so as to obtain an aligned first charging/discharging characteristic. The characteristic calculating module 110 then aligns the second charging/discharging characteristic according to the aligned first charging/discharging characteristic, so as to obtain an aligned second charging/discharging characteristic. More specifically, the characteristic calculating module 110 aligns a first local maximum point 314A, a second local maximum point 314B and a third local maximum point 314C of the dQ/dV-V relationship curve 314 of the charging process in FIG. 3B with a first local maximum point 312A, a second local maximum point 312B and a third local maximum point 312C of the dQ/dV-V relationship curve 312 of the previous charging process respectively. For example, the dQ/dV-V relationship curve 314 is left shifted to obtain an aligned dQ/dV-V relationship curve 314' of the charging process, as shown in FIG. 3C. Referring to FIG. 3C, the first local maximum point 314A, the second local maximum point 314B and the third local maximum point 314C of the dQ/dV-V relationship curve 314 of the charging process in FIG. 3B are corresponding to a first local maximum point 314A', a second local maximum point 314B' and a third local maximum point 314C' of the aligned dQ/dV-V relationship curve 314' of the charging process in FIG. 3C respectively. Further, the horizontal-axis coordinates of the first local maximum point 314A', the second local maximum point 314B' and the third local maximum point 314C' of the aligned dQ/dV-V relationship curve 314' of the charging process are substantially identical to the horizontal-axis coordinates of the first local maximum point 312A, the second local maximum point 312B and the third local maximum point 312C of the dQ/dV-V relationship curve 312 of the previous charging process respectively.

Figure 3D:
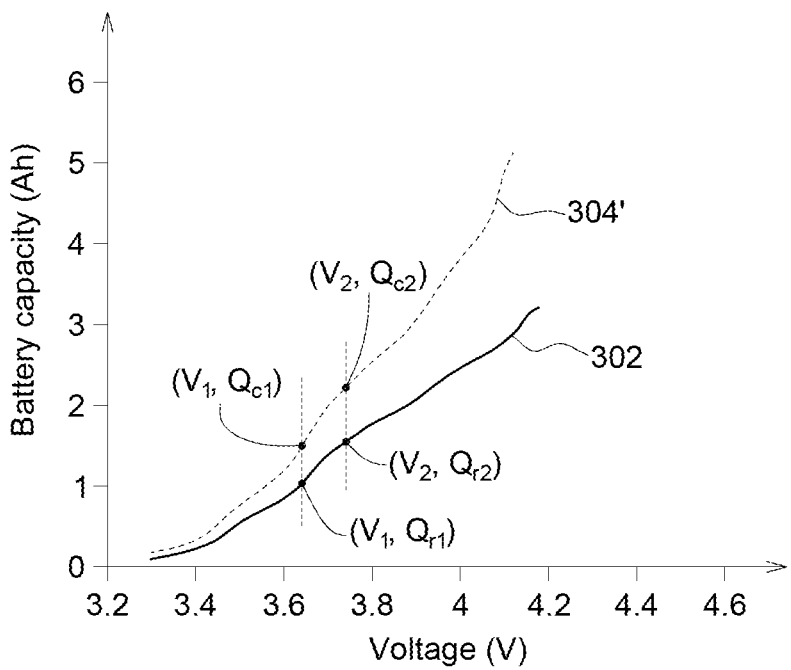

The characteristic calculating module 110 further aligns the Q-V relationship curve 304 of the charging process according to the aligned dQ/dV-V relationship curve 314' of the charging process, so as to obtain an aligned Q-V relationship curve 304' of the charging process. For example, based on a difference between the horizontal-axis coordinate of the first local maximum point 314A of the dQ/dV-V relationship curve 314 of the charging process and the horizontal-axis coordinate of the first local maximum point 314A' of the aligned dQ/dV-V relationship curve 314' of the charging process, the characteristic calculating module 110 shifts the Q-V relationship curve 304 of the charging process to the left to obtain an aligned Q-V relationship curve 304' of the charging process, as shown in FIG. 3D. Aligned charging information can be obtained after the alignment. In this embodiment, aligned charging voltage information and aligned charging battery capacity information can be obtained after the alignment.

Figure 3E:
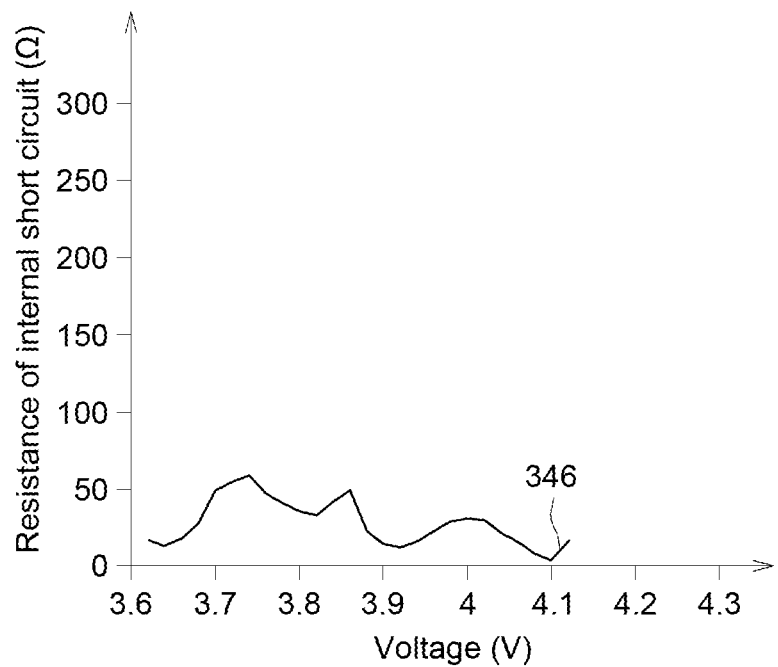

In step S240, the characteristic calculating module 110 determines whether the battery 1021 is normal according to the aligned charging/discharging characteristic or the coulombic efficiency of the battery 1021; when the battery 1021 is determined as abnormal, the ISO resistance calculating module 112 calculates aligned charging/discharging information, and calculates the ISO resistance of the battery 1021 according to the aligned charging/discharging information. Details for determining whether the battery 1021 is normal may be referred to the description of step S242 in FIG. 2. In this embodiment, details for calculating the ISO resistance of the battery 1021 are given below. As shown in FIG. 3D, the aligned charging battery capacity information corresponding to the aligned charging voltage $V_1$ is $Q_{c1}$, the battery capacity information of the comparison characteristic corresponding to the aligned charging voltage $V_1$ is $Q_{r1}$, the aligned charging battery capacity information corresponding to the aligned charging voltage $V_2$ is $Q_{c2}$, and the battery capacity information of the comparison characteristic corresponding to the aligned charging voltage $V_2$ is $Q_{r2}$. In an interval of being charged from the aligned charging voltage $V_1$ to the aligned charging voltage $V_2$, the battery capacity difference is $\Delta Q_{12}=(Q_{c2}-Q_{c1})-(Q_{r2}-Q_{r1})$. The charging time information corresponding to the aligned charging voltage $V_1$ is $t_1$, the charging time information corresponding to the aligned charging voltage $V_2$ is $t_2$. In an interval of being charged from the aligned charging voltage $V_1$ to the aligned charging voltage $V_2$, a charging time difference is $\Delta t=t_2-t_1$, and a current of the internal short circuit $I_{isc12}=\Delta Q_{12}/\Delta t$. The resistance of the internal short circuit is $R_{isc12}=V_{isc12}/I_{isc12}=V_{isc12}/(\Delta Q_{12}/\Delta t)$. In this embodiment, $V_{isc12}$ may be $V_1$ or $V_2$, or may be an average of $V_1$ and $V_2$. A relationship curve 346 of the calculated ISO resistance values and the aligned charging voltage is shown in FIG. 3E. In one embodiment, the ISO resistance calculating module 112 calculates multiple calculated ISO resistance values in the charging voltage range, wherein the multiple calculated ISO resistance values have a corresponding relationship with the aligned charging voltages in the charging voltage range. In one embodiment, the charging voltage range may include all voltages during the charging process, or may include part of the voltages during the charging process. For example, assuming that the charging process is charging from 3.25 V to 4.2 V, all of the ISO resistance values corresponding to the range between 3.25 V and 4.2 V may be calculated, or only the ISO resistance values corresponding to the range between 3.62 V and 4.12 V may be calculated. In one embodiment, the ISO resistance values corresponding to all measured voltages in the charging process can be calculated in one charging process.

FIG. 4A to FIG. 4E show simulation schematic diagrams of a method for detecting ISO resistance of a battery according to another embodiment. Referring to FIG. 1A, FIG. 1D, FIG. 2A, FIG. 2B and FIG. 4A to FIG. 4E, in step S210, the DAQ module 106 measures charging/discharging information of the battery 1021. In this embodiment, the charging/discharging information of the battery 1021 is discharging information during a discharging process. The discharging information includes discharging voltage information, discharging current information, discharging time information and discharging battery temperature information. In this embodiment, the comparison characteristic is a charging characteristic of the battery 1021. In one embodiment, the charging characteristic may be stored in advance in the storage unit 108. In another embodiment, the characteristic calculating module 110 calculates the charging characteristic according to the charging information during the charging process. The charging information includes charging voltage information, charging current information, charging time information and charging battery temperature information. In one embodiment, one charging process may be first performed on the battery 1021 to obtain the charging information, and then one discharging process may be performed to obtain the discharging information. Alternatively, one discharging process may be first performed on the battery 1021 to obtain the discharging information, and then one charging process may be performed to obtain the charging information.

Figure 4A:
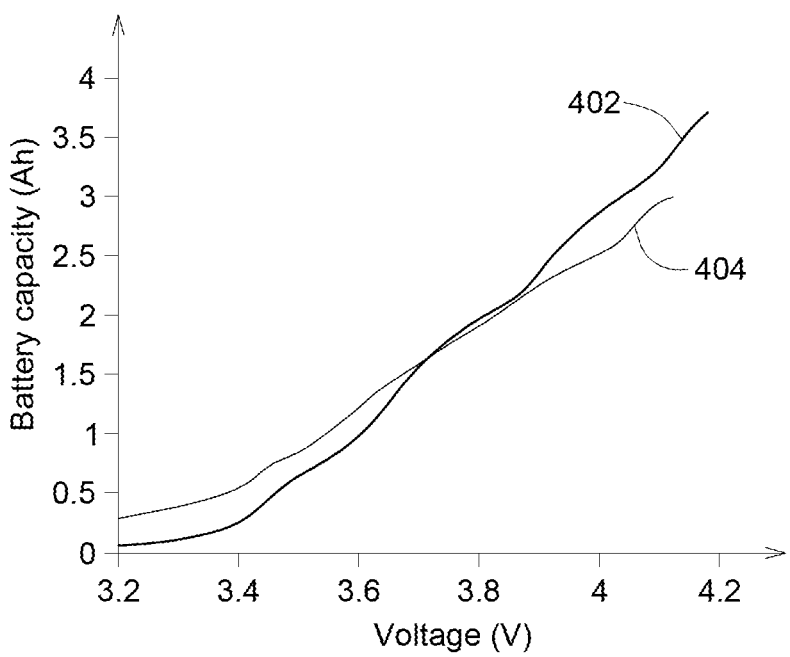
FIGS. 4A to 4E are simulation schematic diagrams of a method for detecting resistance of an internal short circuit of a battery according to another embodiment.

In step S220, the characteristic calculating module 110 calculates the charging/discharging characteristic of the battery 1021 according to the charging/discharging information. In this embodiment, the charging/discharging characteristic includes a first charging/discharging characteristic and a second charging/discharging characteristic. The first charging/discharging characteristic is a dQ/dV-V relationship of a discharging process, and the second charging/discharging characteristic is a Q-V relationship of the discharging process. The comparison characteristic includes a first comparison characteristic and a second comparison characteristic. The first comparison characteristic is a dQ/dV-V relationship of a charging process, and the second comparison characteristic is a Q-V relationship of the charging process. The characteristic calculating module 110 calculates the discharging battery capacity information according to the discharging current information and the discharging time information. In FIG. 4A, the vertical axis is the battery capacity and the horizontal axis is the voltage. The characteristic calculating module 110 draws a Q-V relationship curve 404 of the discharging process. In one embodiment, the characteristic calculating module 110 further draws a Q-V relationship curve 402 of the charging process. In one embodiment, the Q-V relationship curve 402 of the charging process may be stored in the storage unit 108.

Figure 4B:
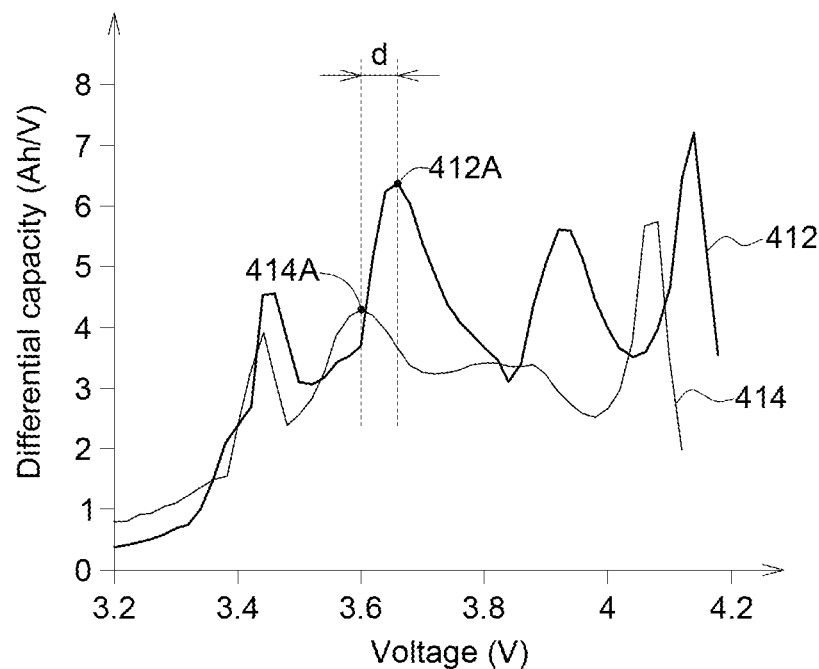

The characteristic calculating module 110 differentiates the discharging battery capacity information with respect to the discharging voltage information to obtain discharging differential capacity information. In FIG. 4B, the vertical axis is the differential capacity and the horizontal axis is the voltage. The characteristic calculating module 110 draws a dQ/dV-V relationship curve 414 of the discharging process. In one embodiment, the characteristic calculating module 110 also draws a dQ/dV-V relationship curve 412 of a charging process. In one embodiment, the dQ/dV-V relationship curve 412 of the charging process may be stored in the storage unit 108.

Figure 4C:
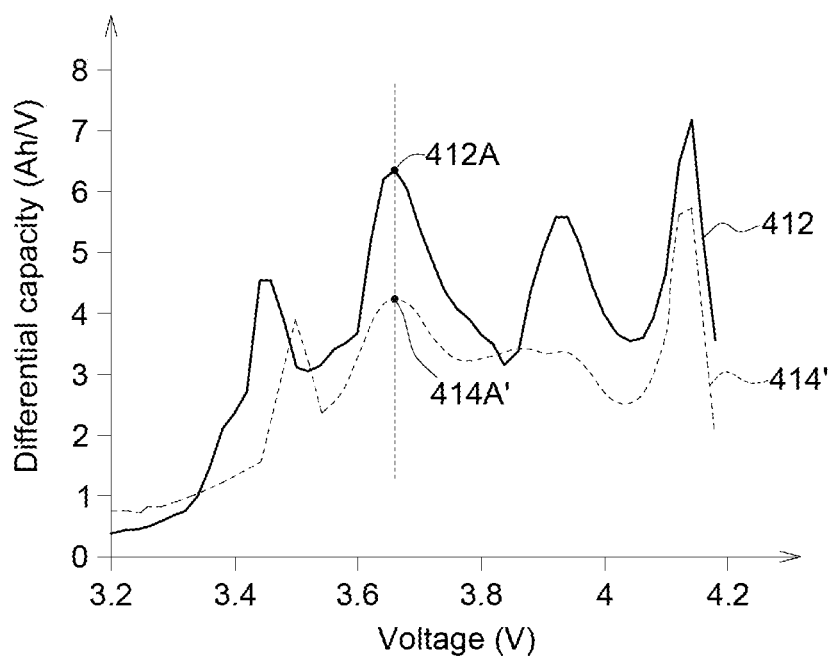

In step S230, the characteristic calculating module 110 aligns the charging/discharging characteristic of the battery 1021 according to the comparison characteristic point of the comparison characteristic, so as to obtain the aligned charging/discharging characteristic. In this embodiment, the characteristic calculating module 110 aligns the first charging/discharging characteristic of the battery 1021 according to the comparison characteristic point of the first comparison characteristic, so as to obtain the aligned first charging/discharging characteristic. The characteristic calculating module 110 then aligns the second charging/discharging characteristic according to the aligned first charging/discharging characteristic, so as to obtain the aligned second charging/discharging characteristic. More specifically, the characteristic calculating module 110 aligns a first local maximum point 414A of the dQ/dV-V relationship curve 414 of the discharging process in FIG. 4B with a first local maximum point 412A of the dQ/dV-V relationship curve 412 of the charging process. For example, the dQ/dV-V relationship curve 414 of the discharging process is right shifted by a displacement d, such that the first local maximum point 414A of the dQ/dV-V relationship curve 414 of the discharging process and the first local maximum point 412A of the dQ/dV-V relationship curve 412 of the charging process have the same horizontal-axis coordinate. An aligned dQ/dV-V relationship curve 414' of a discharging process is obtained as shown in FIG. 4C. After the alignment, the first local maximum point 414A of the dQ/dV-V relationship curve 414 of the discharging process in FIG. 4B becomes the first local maximum point 414A' of the aligned dQ/dV-V relationship curve 414' of the discharging process in FIG. 4C.

Figure 4D:
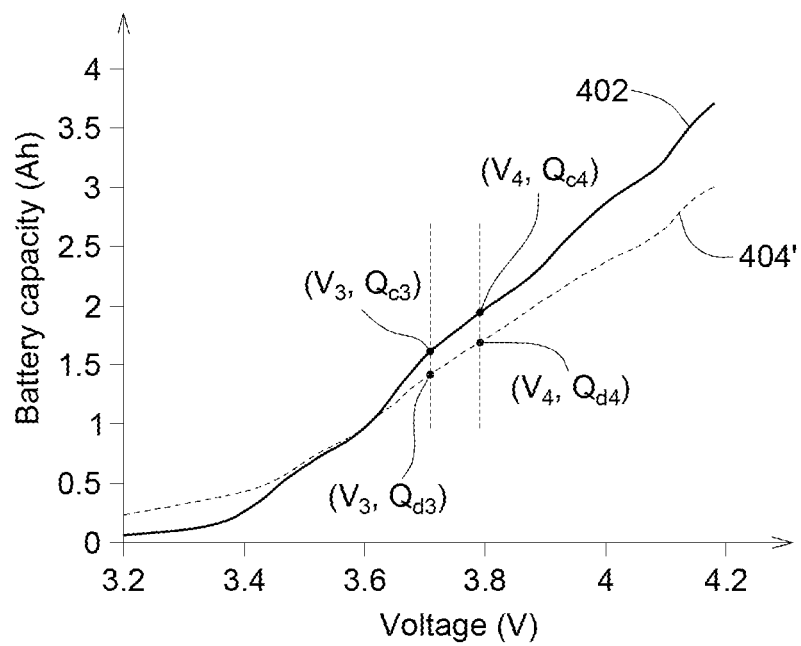

The characteristic calculating module 110 aligns the Q-V relationship curve 404 of the discharging process according to the aligned dQ/dV-V relationship curve 414' of the discharging process, so as to obtain an aligned Q-V relationship curve 404' of the discharging process. For example, the characteristic calculating module 110 shifts the Q-V relationship curve 404 of the discharging process to right by the displacement d to obtain the aligned Q-V relationship curve 404' of the discharging process, as shown in FIG. 4D. After the alignment, the aligned discharging information can be obtained. In this embodiment, the aligned discharging voltage information and the aligned discharging battery capacity information can be obtained after the alignment.

Figure 4E:
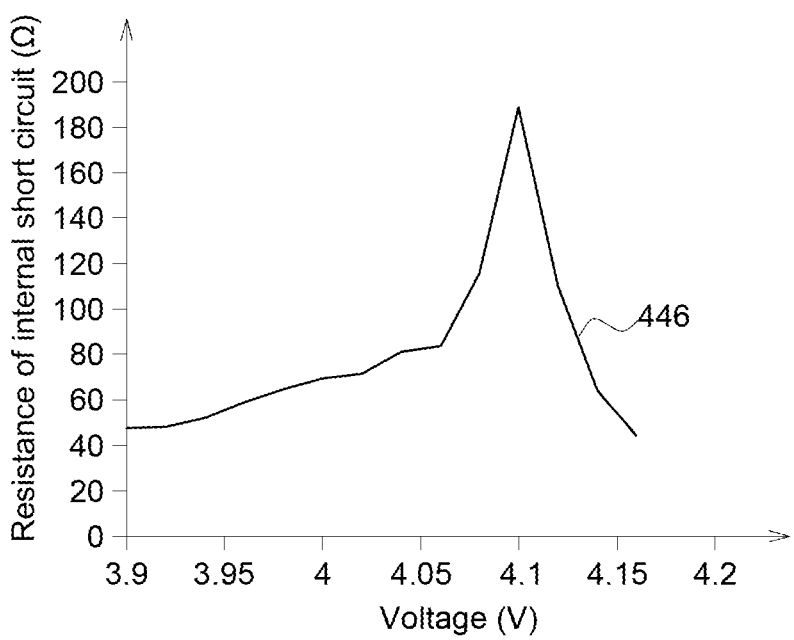

In step S240, the characteristic calculating module 110 determines whether the battery 1021 is normal according to the aligned charging/discharging characteristic or the coulombic efficiency of the battery 1021; when the battery 1021 is determined as abnormal, the ISC resistance calculating module 112 calculates aligned charging/discharging information, and calculates the ISC resistance of the battery 1021 according to the aligned charging/discharging information. Details for determining whether the battery 1021 is normal can be referred to the description of step S242 in FIG. 2B. In this embodiment, details for calculating the ISC resistance are given as below. As shown in FIG. 4D, the aligned discharging battery capacity information corresponding to the aligned discharging voltage $V_3$ is $Q_{d3}$, the charging battery capacity information corresponding to the aligned discharging voltage $V_3$ is $Q_{c3}$, the aligned discharging battery capacity information corresponding to the aligned discharging voltage $V_4$ is $Q_{d4}$, and the charging battery capacity information corresponding to the aligned discharging voltage $V_4$ is $Q_{c4}$. In an interval from the aligned discharging voltage $V_3$ to the aligned discharging voltage $V_4$, the charging battery capacity difference is $\Delta Q_{c34}=(Q_{c4}-Q_{c3})$. The charging battery capacity difference may also be expressed as $\Delta Q_{c34}=(\Delta Q_n+\Delta Q_{cisc})$. The aligned discharging battery capacity difference is $\Delta Q_{d34}=(Q_{d4}-Q_{d3})$. The aligned discharging battery capacity difference may also be expressed as $\Delta Q_{d34}=(\Delta Q_n-\Delta Q_{disc})$. Wherein $\Delta Q_n$ is a normal charging battery capacity or a normal discharging battery capacity in an interval from the aligned discharging voltage $V_3$ to the aligned discharging voltage $V_4$ when the battery 1021 is normal. The normal charging battery capacity is equal to the normal discharging battery capacity, $\Delta Q_{cisc}$ is a charging battery capacity caused by an internal short circuit of the battery in an interval of being charged from the aligned discharging voltage $V_3$ to the aligned discharging voltage $V_4$; and $\Delta Q_{disc}$ is a discharging battery capacity caused by an internal short circuit of the battery in an interval of being discharged from the aligned discharging voltage $V_3$ to the aligned discharging voltage $V_4$. Further, in the charging process, the charging time information corresponding to the aligned discharging voltage $V_3$ is $t_{c3}$, and the charging time information corresponding to the aligned discharging voltage $V_4$ is $t_{c4}$. In the discharging process, the discharging time information corresponding to the aligned discharging voltage $V_3$ is $t_{d3}$, and the discharging time information corresponding to the aligned discharging voltage $V_4$ is $t_{d4}$. In the interval of being charged from the aligned discharging voltage $V_3$ to the aligned discharging voltage $V_4$, a charging time difference is $\Delta t_c=t_{c4}-t_{c3}$. In the interval of being discharged from the aligned discharging voltage $V_4$ to the aligned discharging voltage $V_3$, a discharging time difference is $\Delta t_d=t_{d3}-t_{d4}$. The current of the internal short circuit is $I_{isc34}=(\Delta Q_{cisc}+\Delta Q_{disc})/(\Delta t_c+\Delta t_d)=((\Delta Q_n+\Delta Q_{cisc})-(\Delta Q_n-\Delta Q_{disc}))/(\Delta t_c+\Delta t_d)=(\Delta Q_{c34}-\Delta Q_{d34})/(\Delta t_c+\Delta t_d)$. The resistance of the internal short circuit is $R_{isc34}=V_{isc34}/I_{isc34}=V_{isc34}/((\Delta Q_{c34}-\Delta Q_{d34})/(\Delta t_c+\Delta t_d))$. In this embodiment, $V_{isc34}$ may be $V_3$ or $V_4$, or may be an average of $V_3$ and $V_4$. A relationship curve 446 of the calculated ISO resistance versus the aligned discharging voltage is shown in FIG. 4E. In one embodiment, the ISO resistance calculating module 112 calculates multiple calculated ISO resistance values in the discharging voltage range, wherein the multiple calculated ISO resistance values have a corresponding relationship with the aligned discharging voltages in the discharging voltage range. In one embodiment, the discharging voltage range may include all voltages in the discharging process, or may include part of the voltages in the discharging process. For example, assuming that the discharging process is discharging from 4.2 V to 3.2 V, all of the ISO resistance values corresponding to the range between 4.2 V and 3.2 V may be calculated, or only the ISO resistance values corresponding to the range between 4.152 V and 3.9 V may be calculated. In one embodiment, the ISO resistance values corresponding to all measured voltages in the discharging process can be calculated in one discharging process.

Figure 5A:
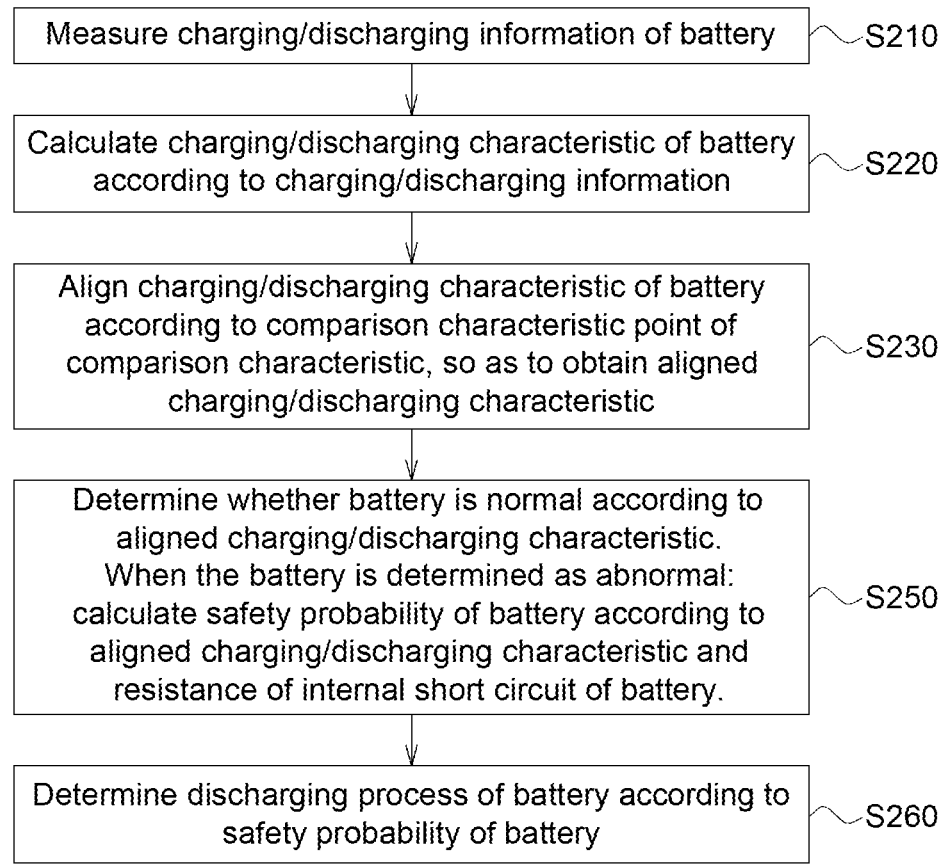
FIG. 5A is a flowchart of a method for determining a discharging process of a battery according to an embodiment.

FIG. 5A shows a flowchart of a method for determining a discharging process of the battery 1021 according to an embodiment. Referring to FIG. 1B, FIG. 1D and FIG. 5A, details of steps S210, S220 and S230 in FIG. 5A may be referred to the description associated with FIG. 1A, FIG. 2B, FIG. 3A to FIG. 3E, and FIG. 4A to FIG. 4E.

In this embodiment, step S250 is performed after step S230. In step S250, the characteristic calculating module 110 is configured to determine whether the battery 1021 is normal according to the aligned charging/discharging characteristic or the coulombic efficiency of the battery 1021; when the battery 1021 is determined as abnormal, the safety probability calculating module 114 is configured to calculate a safety probability of the battery 1021 according to the aligned charging/discharging characteristic and the ISO resistance of the battery 1021. The ISO resistance of the battery 1021 may be calculated according to the above embodiments, or may be fetched from the storage unit 108.

Step S260 is performed after step S250. In step S260, the safety probability calculating module 114 is configured to determine a discharging process of the battery 1021 according to the safety probability of the battery 1021.

Figure 5B:
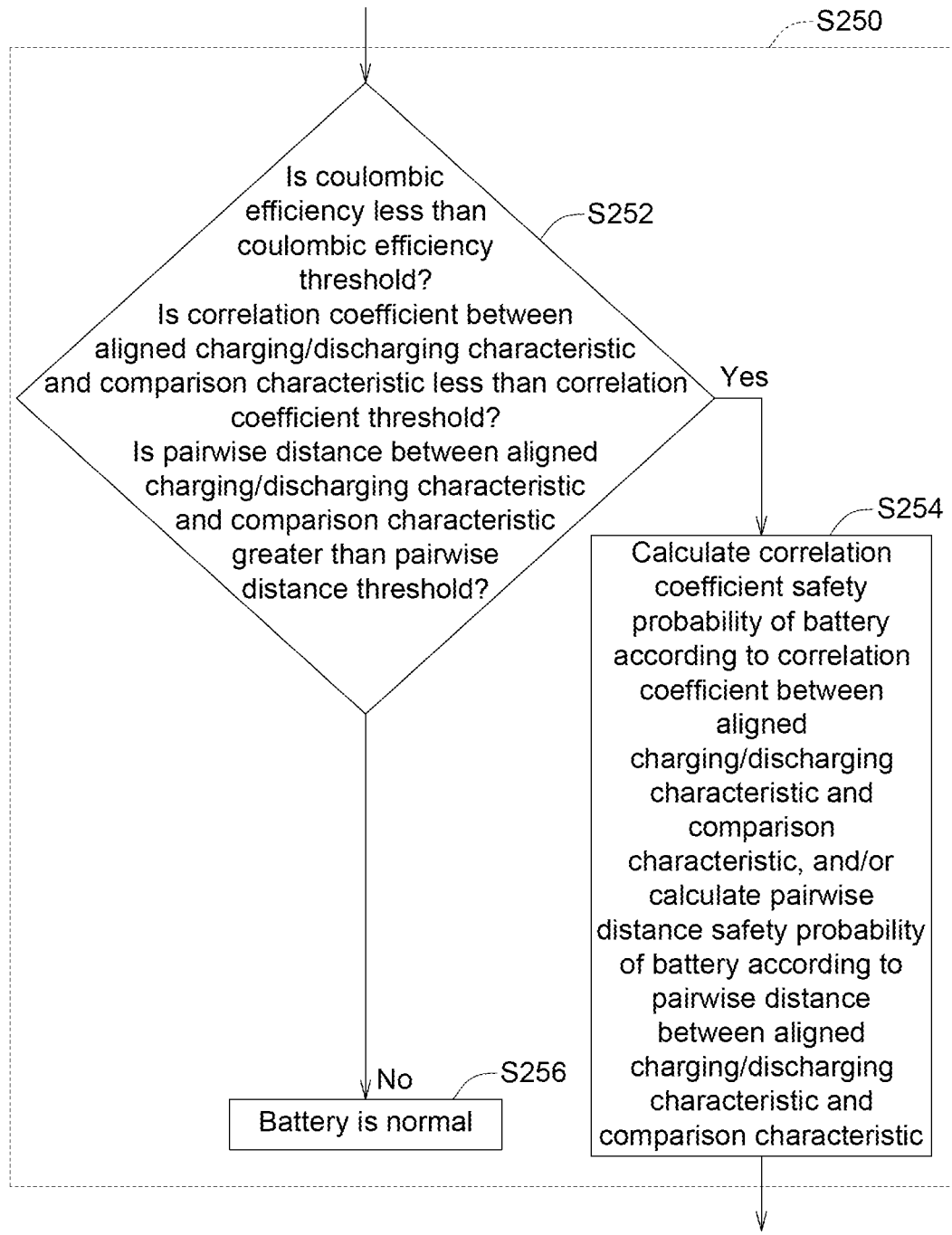
FIG. 5B is a detailed flowchart of step S250 in FIG. 5A according to an embodiment.

FIG. 5B shows a detailed flowchart of step S250 according to an embodiment. Referring to FIG. 1B, FIG. 1D and FIG. 5B, step S250 includes steps S252, S254 and S256. Details of step S252 may be referred to the description associated with step S242 in FIG. 2B. Step S254 is performed if the determination result of step S252 is true, otherwise step S256 is performed. In one embodiment, if the determination result of step S252 is true, the battery 1021 is no longer charged.

In step S254, the safety probability calculating module 114 calculates (a) a correlation coefficient safety probability of the battery 1021 according to a correlation coefficient between the aligned charging/discharging characteristic and the comparison characteristic, and/or (b) a pairwise distance safety probability of the battery 1021 according to a pairwise distance between the aligned charging/discharging characteristic and the comparison characteristic. In one embodiment, the charging/discharging characteristic is a Q-V relationship of a charging process of the battery 1021, and the comparison characteristic is a history charging characteristic, e.g., a Q-V relationship of a previous charging process of the battery 1021. In step S252, the pairwise distance of the battery 1021 is calculated according to the aligned Q-V relationship of the charging process and the Q-V relationship of the previous charging process. In step S254, the safety probability calculating module 114 constructs a pairwise distance graph by taking the value of the pairwise distance as the vertical axis and taking the resistance or the logarithm of the resistance as the horizontal axis. The safety probability calculating module 114 marks the pairwise distance of the battery 1021 and the ISO resistance of the battery 1021 in the pairwise distance graph of the battery 1021, and determines a pairwise distance safety determination range. In one embodiment, the storage unit 108 stores multiple pairwise distance information, e.g., history pairwise distances of the battery 1021 and the corresponding ISO resistance values, or pairwise distances of another battery and the corresponding ISO resistance values. For example, the another battery is a battery of the same manufacturer brand and/or of the same model as the battery 1021. The safety probability calculating module 114 calculates the pairwise distance safety probability of the battery 1021 according to the pairwise distance information in the pairwise distance safety determination range. In one embodiment, the safety probability calculating module 114 calculates the pairwise distance safety probability of the battery 1021 according to danger levels and quantity of events in the pairwise distance information in the pairwise distance safety determination range. In one embodiment, the safety probability calculating module 114 stores the pairwise distance of the battery 1021, the corresponding ISO resistance values of the battery 1021, and/or the events of the battery 1021 (e.g., "abnormal but safe", "abnormal and overheated", or "abnormal and burned") in the storage unit 108 to serve as one set of pairwise distance information for the next determination.

In one embodiment, the charging/discharging characteristic is a dQ/dV-V relationship of a charging process of the battery 1021, and the comparison characteristic is a history charging characteristic of the battery 1021, e.g., a dQ/dV-V relationship of a previous charging process. In step S252, the characteristic calculating module 110 calculates the correlation coefficient of the battery 1021 according to the aligned dQ/dV-V relationship of the charging process and the dQ/dV-V relationship of the previous charging process. In step S254, the safety probability calculating module 114 constructs a correlation coefficient graph by taking the number of correlation coefficients as the vertical axis and the resistance or the logarithm of the resistance as the horizontal axis. The safety probability calculating module 114 marks the correlation coefficients of the battery 1021 and the ISO resistance values of the battery 1021 in the correlation coefficient graph, and determines a correlation coefficient safety determination range. In one embodiment, the storage unit 108 stores multiple correlation coefficient information, e.g., history correlation coefficients of the battery 1021 and the corresponding ISO resistance values, or correlation coefficients of another battery and the corresponding ISO resistance values. For example, the another battery is a battery of the same manufacturer brand and/or of the same model as the battery 1021. The safety probability calculating module 114 calculates the correlation coefficient safety probability of the battery 1021 according to correlation coefficient information in the correlation coefficient safety determination range. In one embodiment, the safety probability calculating module 114 calculates the correlation coefficient safety probability of the battery 1021 according to danger levels and quantity of events in the correlation coefficient information in the correlation coefficient safety determination range. In one embodiment, the safety probability calculating module 114 stores the correlation coefficients of the battery 1021 and the corresponding ISO resistance values of the battery 1021 and/or the events of the battery 1021 (e.g., "abnormal but safe", "abnormal and overheated", or "abnormal and burned") in the storage unit 108 to serve as one set of correlation coefficient information for the next determination.

In step S256, the characteristic calculating module 110 determines the battery 1021 as normal. The battery 1021 can be used normally and/or can be charged and discharged normally. In one embodiment, the safety probability calculating module 114 stores the pairwise distances of the battery 1021, the corresponding ISC resistance values of the battery 1021, and/or events of the battery 1021 (e.g., "normal") in the storage unit 108 to serve as one set of pairwise distance information for the next determination. In one embodiment, the safety probability calculating module 114 stores the correlation coefficients of the battery 1021, the corresponding ISC resistance values of the battery 1021, and/or events of the battery 1021 (e.g., "normal") in the storage unit 108 to serve as one set of correlation coefficient information for the next determination.

Figure 5C:
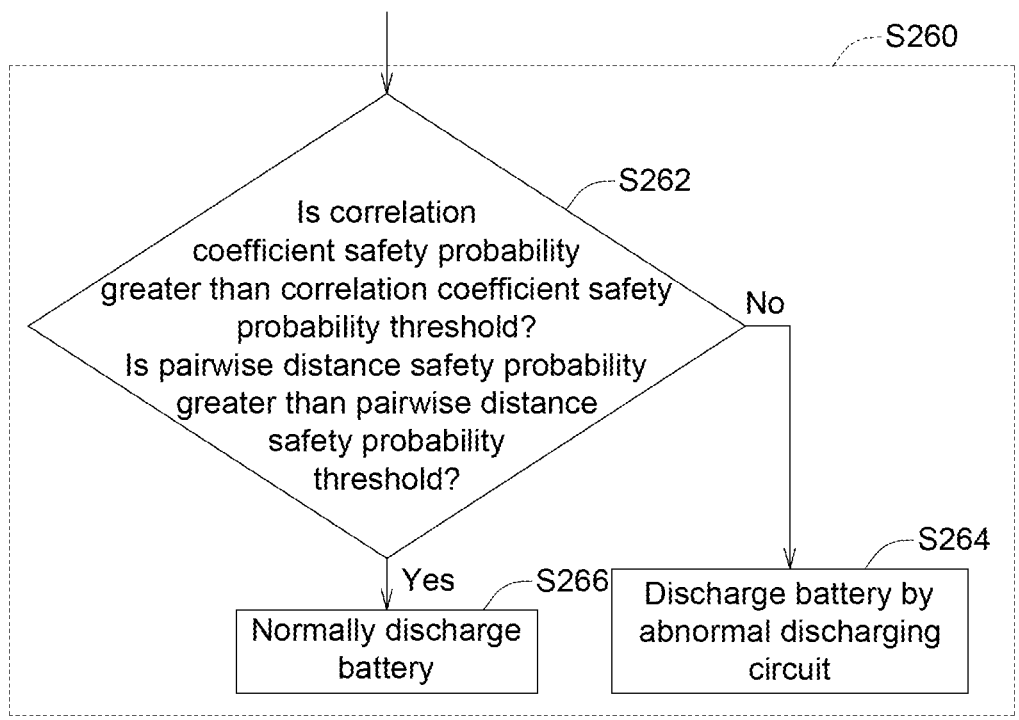
FIG. 5C is a detailed flowchart of step S260 in FIG. 5A according to an embodiment.

FIG. 5C shows a detailed flowchart of step S260 according to an embodiment. Referring to FIG. 1B, FIG. 1D and FIG. 5C, step S260 includes steps S262, S264 and S266.

In step S262, the safety probability calculating module 114 determines (a) whether the correlation coefficient safety probability is greater than a correlation coefficient safety probability threshold, and/or (b) whether the pairwise distance safety probability is greater than a pairwise distance safety probability threshold. In one embodiment, the safety probability calculating module 114 evaluates the correlation coefficient safety probability and the pairwise distance safety probability. The determination result of step S262 is true if the correlation coefficient safety probability is greater than the correlation coefficient safety probability threshold and the pairwise distance safety probability is greater than the pairwise distance safety probability threshold. The determination result of step S262 is false if one of the correlation coefficient safety probability and the pairwise distance safety probability is not greater than the respective threshold. In one embodiment, if the safety probability calculating module 114 determines that the correlation coefficient safety probability is greater than the correlation coefficient safety probability threshold, the determination result of step S262 is true, where the pairwise distance safety probability does not need to be evaluated. In one embodiment, if the safety probability calculating module 114 determines that the pairwise distance safety probability is greater than the pairwise distance safety probability threshold, the determination result of step S262 is true, where the correlation coefficient safety probability does not need to be evaluated. Step S266 is performed if the determination result of step S262 is true, otherwise step S264 is performed.

In step S264, the battery 1021 is discharged by an abnormal discharging circuit 116. In one embodiment, the battery 1021 is no longer charged after it has been discharged. In one embodiment, referring to FIG. 1D, by using the switch 1164, the first end 1162A of the variable resistor 1162 and the first end 102A of the battery 1021 are connected, and the second end 1162B of the variable resistor 1162 and the second end 102B of the battery 1021 are connected, such that the battery 1021 is discharged to the variable resistor 1162.

In step S266, the battery 1021 is normally discharged. In one embodiment, the battery 1021 is normally used, and the battery 1021 is no longer charged after it has been discharged. For example, the battery 1021 is a battery in a cell phone. The cell phone can be used normally until the power in the battery 1021 is depleted and then the battery 1021 is no longer charged. In one embodiment, referring to FIG. 1D, by using the switch 1164, the variable resistor 1162 and the battery 1021 are not connected with each other, such that the battery 1021 is discharged normally.

Figure 6A:
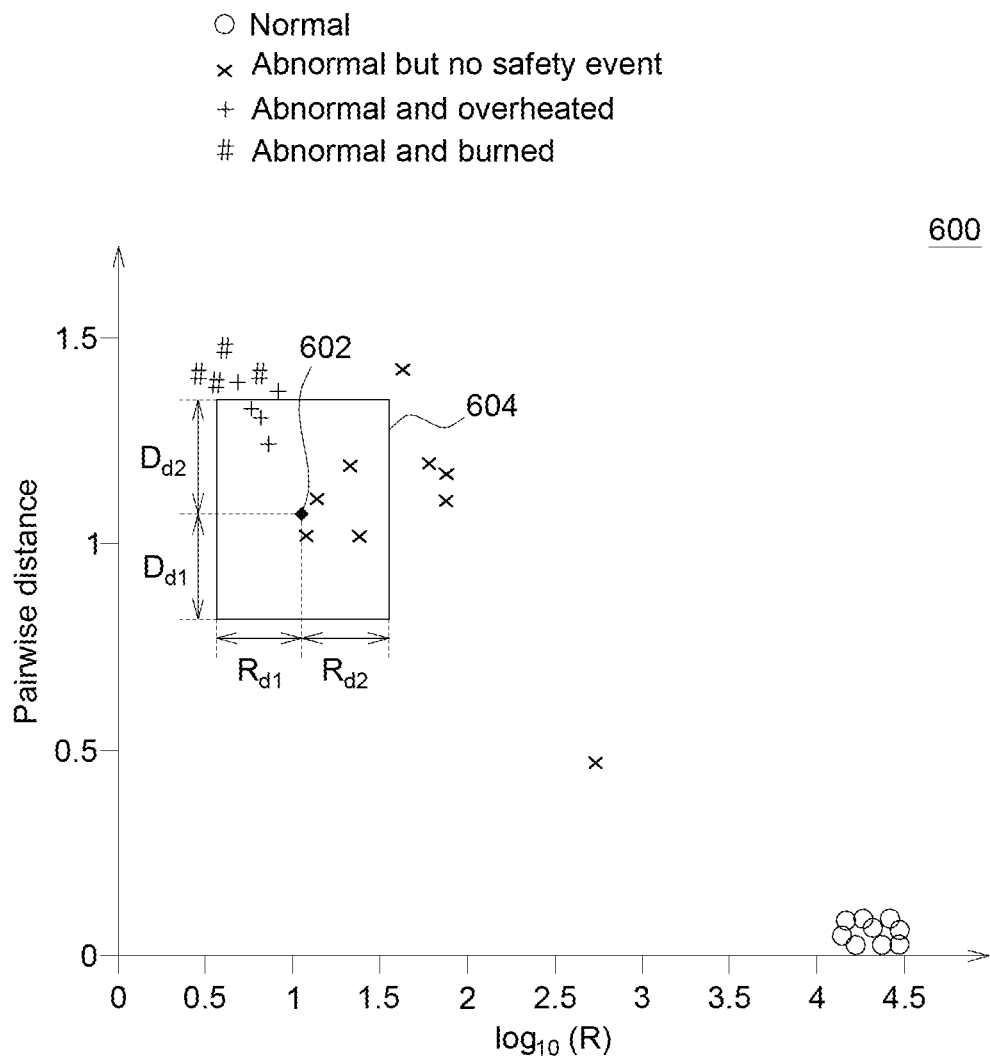
FIG. 6A is a pairwise distance graph of a battery according to an embodiment.

FIG. 6A shows a pairwise distance graph 600 of the battery 1021 according to an embodiment. Refer to FIG. 1B, FIG. 1D, FIG. 5A to FIG. 5C and FIG. 6A. In FIG. 6A, the horizontal axis (X-axis) represents the logarithm with base 10 ($\log_{10}$ R) of the resistance, and the vertical axis (Y-axis) represents the pairwise distance value. In one embodiment, the base of the logarithm of the resistance may be 2 or other values instead of 10. In this embodiment, the battery 1021 is determined as abnormal in step S252. The pairwise distance of the battery 1021 and the ISC resistance value of the battery 1021 is marked in the pairwise distance graph 600 as an abnormal point 602 in step S254. In the pairwise distance graph 600, in addition to the abnormal point 602, multiple pieces of pairwise distance information are further included. In this embodiment, the pairwise distance information of a battery of the same manufacturer brand and the same model as the battery 1021 is also marked in the pairwise distance graph 600. The pairwise distance information is categorized into "normal", "abnormal but no safety event", "abnormal and overheated", and "abnormal and burned". For example, "normal" represents being determined as normal in a previous measurement, "abnormal but no safety event" represents being determined as abnormal in the previous measurement but no safety event was incurred, "abnormal and overheated" represents being determined as abnormal in the previous measurement and the battery was overheated, and "abnormal and burned" represents being determined as abnormal in the previous measurement and burning took place. In the pairwise distance graph 600, the abnormal point 602 is used as the basis, and the pairwise distance safety determination range 604 is constructed according to a measurement error, a calculation error and/or a predetermined error value. In this embodiment, the coordinates of the abnormal point 602 are ($X_{602}$, $Y_{602}$). There are a first resistance error $R_{d1}$ and a second resistance error $R_{d2}$ on the X-axis, and there are a first pairwise distance error $D_{d1}$ and a second pairwise distance error $D_{d2}$ on the Y-axis. Using the abnormal point 602 as the basis, the pairwise distance safety determination range 604 is constructed between the X-axis coordinates ($X_{602}-R_{d1}$) and ($X_{602}+R_{d2}$) and between the Y-axis coordinates ($Y_{602}-D_{d1}$) and ($Y_{602}+D_{d2}$). In one embodiment, the first resistance error $R_{d1}$ and the second resistance error $R_{d2}$ may be the same or different, and the first pairwise distance error $D_{d1}$ and the second pairwise distance error $D_{d2}$ may be the same or different.

In one embodiment, the pairwise distance safety probability is ((quantity of normal+quantity of abnormal but no safety events)/(quantity of normal+quantity of abnormal but no safety events+quantity of abnormal and overheated+quantity of abnormal and burned))*100%; the pairwise distance safety probability threshold is 90%. The safety probability calculating module 114 counts 7 pieces of pairwise distance information within the pairwise distance safety determination range 604. Among the 7 pieces of pairwise distance information, 0 is "normal", 4 are "abnormal but no safety event", 3 are "abnormal and overheated", and 0 is "abnormal and burned". Thus, the safety probability calculating module 114 calculates the pairwise distance safety probability as ((0+4)/(0+4+3+0))*100%=(4/7)*100%. In this embodiment, the pairwise distance safety probability is about 57%. Thus, in step S262, the safety probability calculating module 114 determines that the pairwise distance safety probability is not greater than the pairwise distance safety probability threshold, and step S264 is performed to discharge the battery 1021 by the abnormal discharging circuit 116.

Figure 6B:
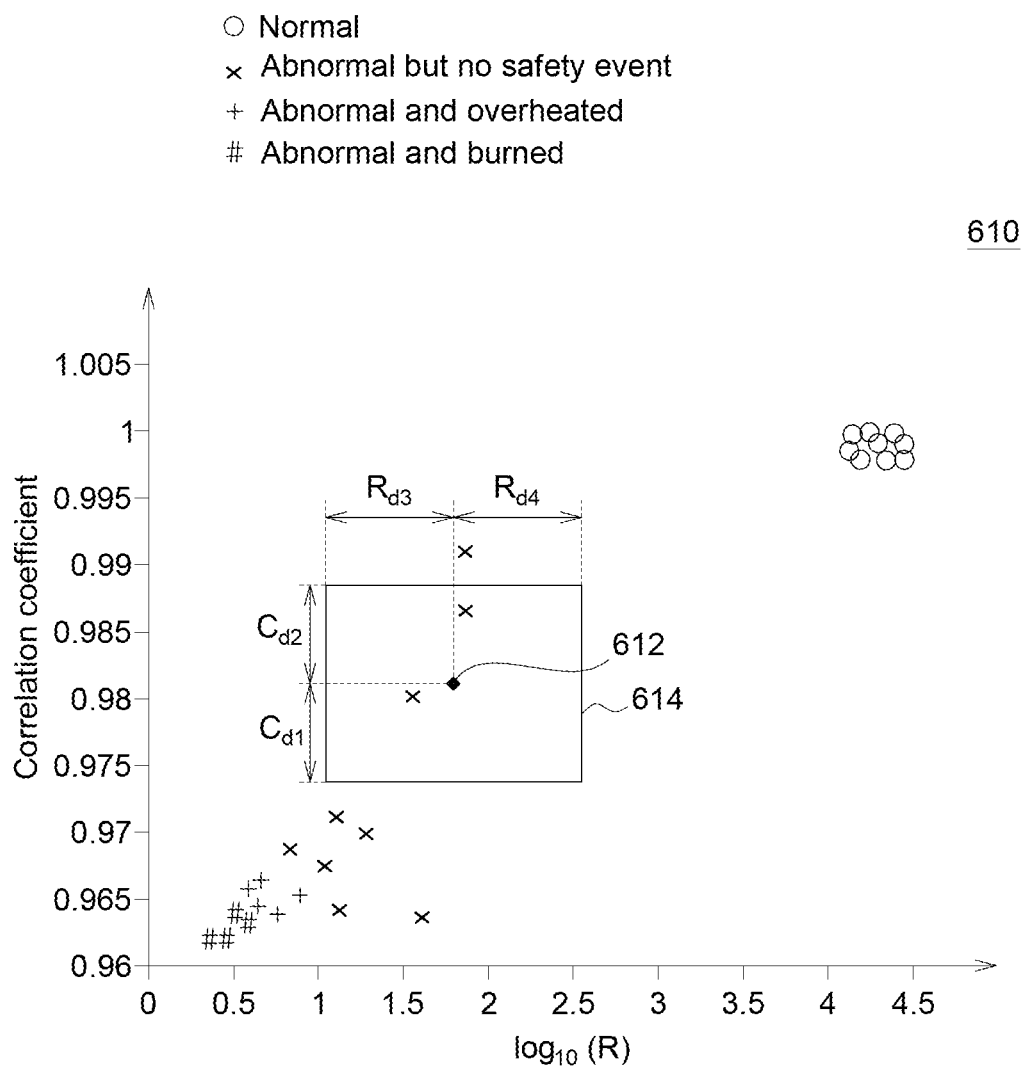
FIG. 6B is a correlation coefficient graph of a battery according to an embodiment.

FIG. 6B shows a correlation coefficient graph 610 of the battery 1021 according to an embodiment. Refer to FIG. 1B, FIG. 1D, FIG. 5A to FIG. 5C and FIG. 6B. In FIG. 6B, the horizontal axis (X-axis) represents the logarithm with base 10 ($\log_{10}$ R) of the resistance, and the vertical axis (Y-axis) represents the correlation coefficient. In one embodiment, the base of the logarithm of the resistance may be 2 or other values instead of 10. In this embodiment, the battery 1021 is determined as abnormal in step S252. The correlation coefficient of the battery 1021 and the ISO resistance value of the battery 1021 is marked in the correlation coefficient graph 610 as an abnormal point 612 in step S254. In the correlation coefficient graph 610, in addition to the abnormal point 612, multiple pieces of correlation coefficient information are further included. In this embodiment, the correlation coefficient information of a battery of the same manufacturer brand and the same model as the battery 1021 is also marked in the correlation coefficient graph 610. The correlation coefficient information is categorized into "normal", "abnormal but no safety event", "abnormal and overheated", and "abnormal and burned". For example, "normal" represents being determined as normal in a previous measurement, "abnormal but no safety event" represents being determined as abnormal in the previous measurement but no safety event was incurred, "abnormal and overheated" represents being determined as abnormal in the previous measurement and the battery was overheated, and "abnormal and burned" represents being determined as abnormal in the previous measurement and burning took place. In the correlation coefficient graph 610, the abnormal point 612 is used as the basis, and a correlation coefficient safety determination range 614 is constructed according to a measurement error, a calculation error and/or a predetermined error value. In this embodiment, the coordinates of the abnormal point 612 are $(X_{612}, Y_{612})$. There are a third resistance error $R_{d3}$ and a fourth resistance error $R_{d4}$ on the X-axis, and there are a first correlation coefficient error $C_{d1}$ and a second correlation coefficient error $C_{d2}$ on the Y-axis. Using the abnormal point 612 as the basis, the correlation coefficient safety determination range 614 is constructed between the X-axis coordinates $(X_{612}-R_{d3})$ and $(X_{612}+R_{d4})$ and between the Y-axis coordinates $(Y_{612}-C_{d2})$ and $(Y_{612}+C_{d2})$. In one embodiment, the third resistance error $R_{d3}$ and the fourth resistance error $R_{d4}$ may be the same or different, and the first correlation coefficient error $C_{d1}$ and the second correlation coefficient error $C_{d2}$ may be the same or different.

In one embodiment, the correlation coefficient safety probability is ((quantity of normal+quantity of abnormal but no safety event)/(quantity of normal+quantity of abnormal but no safety event+quantity of abnormal and overheated+quantity of abnormal and burned))*100%; the correlation coefficient safety probability threshold is 90%. The safety probability calculating module 114 counts 2 pieces of correlation coefficient information within the correlation coefficient safety determination range 614. Among the 2 pieces of pairwise distance information, 0 is "normal", 2 are "abnormal but no safety event", 0 is "abnormal and overheated", and 0 is "abnormal and burned". Thus, the safety probability calculating module 114 calculates the correlation coefficient safety probability as ((0+2)/(0+2+0+0))*100%=100%. In this embodiment, the correlation coefficient safety probability is 100%. Thus, in step S262, the safety probability calculating module 114 determines that the correlation coefficient safety probability is greater than the correlation coefficient safety probability threshold, and step S266 is performed to normally discharge the battery 1021.

Figure 7:
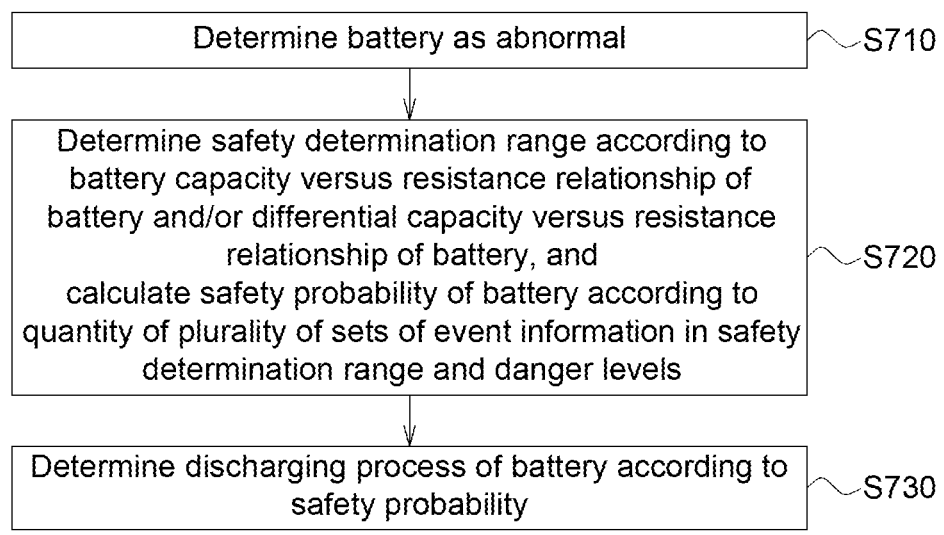
FIG. 7 is a flowchart of a method for determining a discharging process of a battery according to an embodiment.

FIG. 7 shows a flowchart of a method for determining a discharging process of the battery 1021 according to an embodiment. Please also refer to FIG. 1B, FIG. 1D, FIG. 5A to FIG. 5C, FIG. 6A, FIG. 6B and FIG. 7. In step S710, the characteristic calculating module 110 determines the battery 1021 as abnormal. In step S720, the safety probability calculating module 114 is configured to determine a safety determination range according to (a) the relationship between the battery capacity and resistance of the battery 1021 and/or (b) the relationship between the differential capacity and resistance of the battery 1021. The safety probability calculating module 114 is also configured to calculate the safety probability of the battery according to the quantity and danger levels of multiple event information in the safety determination range. In step S730, the safety probability calculating module 114 determines the discharging process of the battery 1021 according to the safety probability of the battery 1021. In one embodiment, the battery 1021 is discharged according to the discharging process. The safety determination range may be a pairwise distance safety determination range and/or a correlation coefficient safety determination range. The multiple event information may be pairwise distance information and/or correlation coefficient information. Details of this embodiment may be referred to the description associated with FIG. 1B, FIG. 1D, FIG. 5A to FIG. 5C, FIG. 6A and FIG. 6B.

Figure 8:
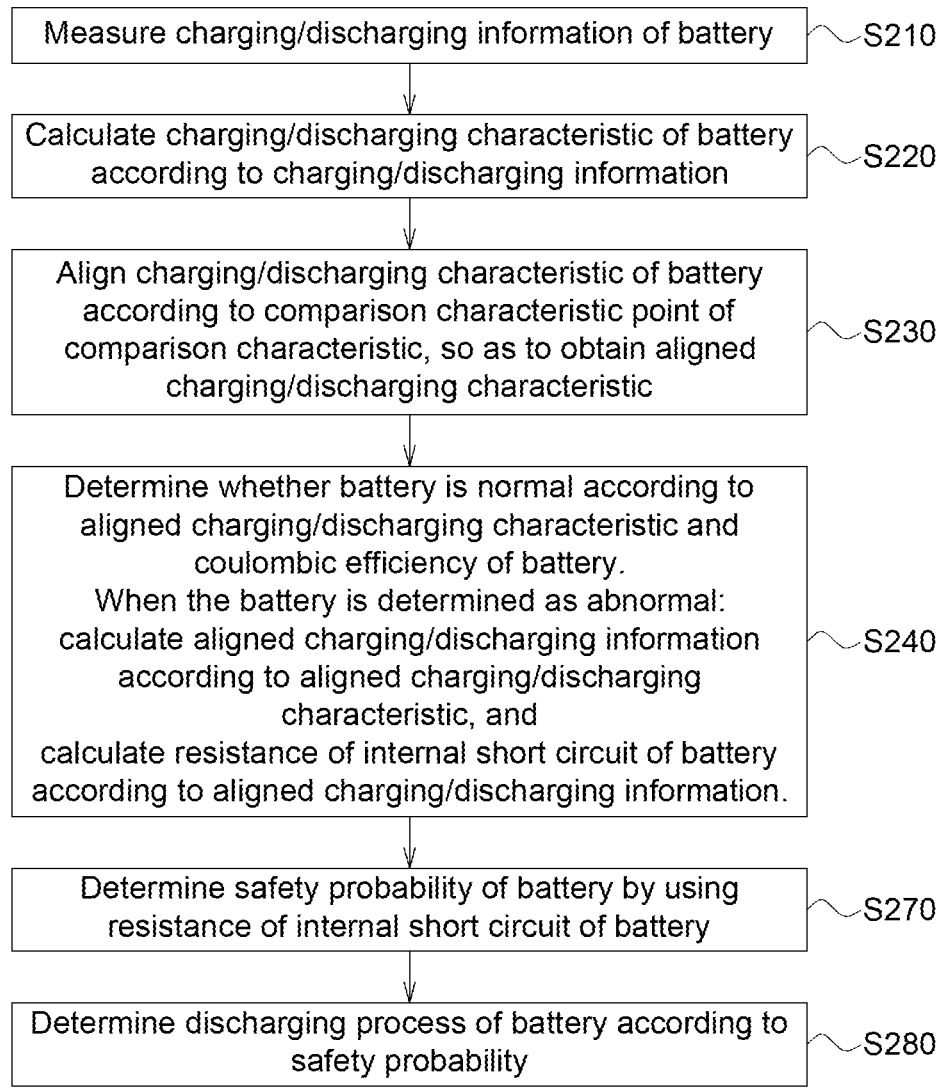
FIG. 8 is a flowchart of a method for detecting resistance of an internal short circuit of a battery and a method for determining a discharging process of a battery according to an embodiment.

FIG. 8 shows a flowchart of a method for detecting ISC resistance of the battery 1021 and a method for determining a discharging process of the battery 1021 according an embodiment. Referring to FIG. 10, FIG. 1D and FIG. 8, in step S210, the DAQ module 106 measures charging/discharging information of the battery 1021. In step S220, the characteristic calculating module 110 calculates a charging/discharging characteristic according to the charging/discharging information of the battery 1021. In step S230, the characteristic calculating module 110 aligns the charging/discharging characteristic of the battery 1021 according to a comparison characteristic point of a comparison characteristic, so as to obtain an aligned charging/discharging characteristic. In step S240, the characteristic calculating module 110 determines whether the battery 1021 is normal according to the aligned charging/discharging characteristic of the battery 1021 or a coulombic efficiency of the battery 1021. When the battery 1021 is determined as abnormal, the ISO resistance calculating module 112 calculates the aligned charging/discharging information, and calculates the ISO resistance of the battery 1021 according to the aligned charging/discharging information. In step S270, the safety probability calculating module 114 determines the safety probability of the battery 1021 by using the ISO resistance of the battery 1021. In step S280, the safety probability calculating module 114 is configured to determine a discharging process of the battery 1021 according to the safety probability. Details of this embodiment may be referred to the description of the foregoing embodiments.

According to an embodiment, a function of detecting an internal short circuit of a battery at an early stage is provided. Thus, a battery system is able to detect whether a characteristic in a charging or discharging interval is changed during a charging or discharging process, so as to further analyze whether an internal short circuit occurs and calculate the resistance of the internal short circuit According to an embodiment, a function of detecting an internal short circuit of a battery at an early stage is provided. Thus, a battery system is able to detect whether a characteristic in a charging or discharging interval is changed during a charging or discharging process, such that a safety probability value can be calculated when the internal short circuit is moderate at an early stage, so as to provide appropriate early warning and reactive measures.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for detecting resistance of an internal short circuit of a battery, comprising:
    measuring charging/discharging information of the battery, wherein the charging/discharging information comprises voltage information, current information, charging/discharging time information or battery temperature information;
    calculating a charging/discharging characteristic of the battery according to the charging/discharging information, wherein the charging/discharging characteristic comprises a relationship between battery capacity information of the battery and the voltage information of the battery;

aligning a charging/discharging characteristic point of the charging/discharging characteristic of the battery according to a coordinate data comparison characteristic point of a comparison characteristic to obtain an aligned charging/discharging characteristic; and determining whether the battery is normal according to the aligned charging/discharging characteristic or a coulombic efficiency of the battery, and when the battery is determined as abnormal, calculating aligned charging/discharging information of the battery according to the aligned charging/discharging characteristic, and calculating the resistance of the internal short circuit of the battery according to the aligned charging/discharging information, wherein the aligned charging/discharging information comprises aligned voltage information, aligned current information, aligned battery capacity information or aligned charging/discharging time information.

2. The method for detecting the resistance of the internal short circuit of the battery according to claim 1, wherein the step of calculating the charging/discharging characteristic of the battery according to the charging/discharging information comprises:

calculating the battery capacity information of the battery according to the current information and the charging/discharging time information of the battery; and drawing a battery capacity versus voltage relationship curve to obtain a battery capacity versus voltage relationship.

3. The method for detecting the resistance of the internal short circuit of the battery according to claim 2, wherein the step of calculating the charging/discharging characteristic of the battery according to the charging/discharging information further comprises:

differentiating the battery capacity information with respect to the voltage information to obtain a differential capacity information; and drawing a differential capacity versus voltage relationship curve to obtain a differential capacity versus voltage relationship.

4. The method for detecting the resistance of the internal short circuit of the battery according to claim 1, wherein the charging/discharging characteristic comprises a relationship curve of the battery capacity information of the battery and the voltage information of the battery, the relationship curve of the charging/discharging characteristic comprises the charging/discharging characteristic point, and the step of aligning the charging/discharging characteristic of the battery according to the coordinate data comparison characteristic point of the comparison characteristic to obtain the aligned charging/discharging characteristic comprises:

shifting the relationship curve of the charging/discharging characteristic such that a horizontal-axis coordinate or a vertical-axis coordinate of the charging/discharging characteristic point of the relationship curve of the charging/discharging characteristic is identical to a horizontal-axis coordinate or a vertical-axis coordinate of the comparison characteristic point of the comparison characteristic.

5. The method for detecting the resistance of the internal short circuit of the battery according to claim 1, wherein the charging/discharging characteristic comprises a first charging/discharging characteristic and a second charging/discharging characteristic, and the step of aligning the charging/discharging characteristic of the battery according to the coordinate data comparison characteristic point of the comparison characteristic to obtain the aligned charging/discharging characteristic comprises:

aligning the first charging/discharging characteristic of the battery according to the coordinate data comparison characteristic point of the comparison characteristic to obtain an aligned first charging/discharging characteristic, and aligning the second charging/discharging characteristic according to the aligned first charging/discharging characteristic to obtain an aligned second charging/discharging characteristic.

6. The method for detecting the resistance of the internal short circuit of the battery according to claim 5, wherein the first charging/discharging characteristic is a differential capacity versus voltage relationship of the battery, and the second charging/discharging characteristic is a battery capacity versus voltage relationship of the battery.

7. The method for detecting the resistance of the internal short circuit of the battery according to claim 1, wherein the step of determining whether the battery is normal according to the aligned charging/discharging characteristic or the coulombic efficiency of the battery comprises:

determining whether the coulombic efficiency of the battery is less than a coulombic efficiency threshold, whether a correlation coefficient between the aligned charging/discharging characteristic and the comparison characteristic is less than a correlation coefficient threshold, or whether a pairwise distance between the charging/discharging characteristic point of the aligned charging/discharging characteristic and the coordinate data comparison characteristic point of the comparison characteristic is greater than a pairwise distance threshold.

8. The method for detecting the resistance of the internal short circuit of the battery according to claim 7, wherein the step of determining whether the battery is normal according to the aligned charging/discharging characteristic or the coulombic efficiency of the battery, and calculating the resistance of the internal short circuit of the battery according to the aligned charging/discharging characteristic when the battery is determined as abnormal further comprises:

if the coulombic efficiency of the battery is not less than the coulombic efficiency threshold, the correlation coefficient between the aligned charging/discharging characteristic and the comparison characteristic is not less than the correlation coefficient threshold and the pairwise distance between the aligned charging/discharging characteristic and the comparison characteristic is not greater than the pairwise distance threshold, determining the battery as normal; and normally using the battery or normally charging/discharging the battery.

9. The method for detecting the resistance of the internal short circuit of the battery according to claim 7, wherein the step of determining whether the battery is normal according to the aligned charging/discharging characteristic, and calculating the resistance of the internal short circuit of the battery according to the aligned charging/discharging characteristic when the battery is determined as abnormal further comprises:

if the coulombic efficiency of the battery is less than the coulombic efficiency threshold, the correlation coefficient between the aligned charging/discharging characteristic and the comparison characteristic is less than the correlation coefficient threshold, or the pairwise distance between the aligned charging/discharging characteristic and the comparison characteristic is greater than the pairwise distance threshold, determining the battery as abnormal.

10. The method for detecting the resistance of the internal short circuit of the battery according to claim 1, further comprises:
determining a safety probability by using the resistance of the internal short circuit of the battery; and
determining a discharging process of the battery according to the safety probability.

11. The method for detecting the resistance of the internal short circuit of the battery according to claim 1, wherein the charging/discharging characteristic is a charging characteristic of the battery or a discharging characteristic of the battery, and the comparison characteristic is a history charging characteristic of the battery, a history discharging characteristic of the battery, a history charging characteristic of another battery, or a history discharging characteristic of the another battery.

12. The method for detecting the resistance of the internal short circuit of the battery according to claim 1, wherein the charging/discharging characteristic is one of a charging characteristic of the battery and a discharging characteristic of the battery, and the comparison characteristic is the another of the charging characteristic of the battery and the discharging characteristic of the battery.

13. A system for detecting resistance of an internal short circuit of a battery, comprising:
a battery set, comprising a battery;
a data acquisition module, configured to measure charging/discharging information of the battery, wherein the charging/discharging information comprises voltage information, current information, charging/discharging time information or battery temperature information;
a characteristic calculating module, configured to calculate a charging/discharging characteristic of the battery according to the charging/discharging information, align a charging/discharging characteristic point of the calculated charging/discharging characteristic of the battery according to a coordinate data comparison characteristic point of a comparison characteristic to obtain an aligned charging/discharging characteristic, and determine whether the battery is normal according to the aligned charging/discharging characteristic or a coulombic efficiency of the battery, wherein the charging/discharging characteristic comprises a relationship between battery capacity information of the battery and the voltage information of the battery; and
an internal short-circuit resistance calculating module, configured to calculate aligned charging/discharging information according to the aligned charging/discharging characteristic and calculate the resistance of the internal short circuit of the battery according to the aligned charging/discharging information when the battery is determined as abnormal, wherein the aligned charging/discharging information comprises aligned voltage information, aligned current information, aligned battery capacity information or aligned charging/discharging time information.

14. The system for detecting the resistance of the internal short circuit of the battery according to claim 13, wherein the characteristic calculating module is configured to calculate the battery capacity information of the battery according to the current information and the charging/discharging time information of the battery, and draw a battery capacity versus voltage relationship curve to obtain a battery capacity versus voltage relationship.

15. The system for detecting the resistance of the internal short circuit of the battery according to claim 14, wherein the characteristic calculating module is further configured to differentiate the battery capacity information with respect to the voltage information to obtain a differential capacity information, and draw a differential capacity versus voltage relationship curve to obtain a differential capacity versus voltage relationship.

16. The system for detecting the resistance of the internal short circuit of the battery according to claim 13, wherein the charging/discharging characteristic comprises a relationship curve of the battery capacity information of the battery and the voltage information of the battery, and the characteristic calculating module shifts the relationship curve of the charging/discharging characteristic such that a horizontal-axis coordinate or a vertical-axis coordinate of the charging/discharging characteristic point of the relationship curve of the charging/discharging characteristic is identical to a horizontal-axis coordinate or a vertical-axis coordinate of the coordinate data comparison characteristic point of the comparison characteristic.

17. The system for detecting the resistance of the internal short circuit of the battery according to claim 13, wherein the charging/discharging characteristic comprises a first charging/discharging characteristic and a second charging/discharging characteristic, and the characteristic calculating module is configured to align the first charging/discharging characteristic of the battery according to the coordinate data comparison characteristic point of the comparison characteristic to obtain an aligned first charging/discharging characteristic, and align the second charging/discharging characteristic according to the aligned first charging/discharging characteristic to obtain an aligned second charging/discharging characteristic.

18. The system for detecting the resistance of the internal short circuit of the battery according to claim 17, wherein the first charging/discharging characteristic is a differential capacity versus voltage relationship of the battery, and the second charging/discharging characteristic is a battery capacity versus voltage relationship of the battery.

19. The system for detecting the resistance of the internal short circuit of the battery according to claim 13, wherein the characteristic calculating module is configured to determine whether the coulombic efficiency of the battery is less than a coulombic efficiency threshold, whether a correlation coefficient between the aligned charging/discharging characteristic and the comparison characteristic is less than a correlation coefficient threshold, or whether a pairwise distance between the charging/discharging characteristic point of the aligned charging/discharging characteristic and the coordinate data comparison characteristic point of the comparison characteristic is greater than a pairwise distance threshold.

20. The system for detecting the resistance of the internal short circuit of the battery according to claim 19, wherein if the characteristic calculating module determines that the coulombic efficiency of the battery is not less than the coulombic efficiency threshold, the correlation coefficient between the aligned charging/discharging characteristic and the comparison characteristic is not less than the correlation coefficient threshold and the pairwise distance between the aligned charging/discharging characteristic and the comparison characteristic is not greater than the pairwise distance threshold, the characteristic calculating module is configured to determine the battery as normal, and the system for detecting the resistance of the internal short circuit of the battery normally uses the battery or normally charges/discharges the battery.

21. The system for detecting the resistance of the internal short circuit of the battery according to claim 19, wherein if the characteristic calculating module determines that the coulombic efficiency of the battery is less than the coulombic efficiency threshold, the correlation coefficient between the aligned charging/discharging characteristic and the comparison characteristic is less than the correlation coefficient threshold, or the pairwise distance between the aligned charging/discharging characteristic and the comparison characteristic is greater than the pairwise distance threshold, the characteristic calculating module determines the battery as abnormal.

22. The system for detecting the resistance of the internal short circuit of the battery according to claim 13, further comprising:
  a safety probability calculating module, configured to determine a safety probability by using the resistance of the internal short circuit of the battery, and determine a discharging process of the battery according to the safety probability.

23. The system for detecting the resistance of the internal short circuit of the battery according to claim 13, wherein the charging/discharging characteristic is a charging characteristic of the battery or a discharging characteristic of the battery, and the comparison characteristic is a history charging characteristic of the battery, a history discharging characteristic of the battery, a history charging characteristic of another battery, or a history discharging characteristic of the another battery.

24. The system for detecting the resistance of the internal short circuit of the battery according to claim 13, wherein the charging/discharging characteristic is one of a charging characteristic of the battery and a discharging characteristic of the battery, and the comparison characteristic is the another of the charging characteristic of the battery and the discharging characteristic of the battery.

* * * * *